(12) United States Patent
Tanaka et al.

(10) Patent No.: US 8,891,170 B2
(45) Date of Patent: Nov. 18, 2014

(54) LASER IRRADIATION APPARATUS AND MANUFACTURING METHOD OF SEMICONDUCTOR DEVICE

(75) Inventors: Koichiro Tanaka, Kanagawa (JP); Hirotada Oishi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 435 days.

(21) Appl. No.: 13/172,443

(22) Filed: Jun. 29, 2011

(65) Prior Publication Data
US 2011/0255172 A1 Oct. 20, 2011

Related U.S. Application Data

(62) Division of application No. 11/583,844, filed on Oct. 20, 2006, now Pat. No. 8,000,016.

(30) Foreign Application Priority Data

Oct. 26, 2005 (JP) .................................. 2005-310871

(51) Int. Cl.
| | | |
|---|---|---|
| G02B 27/10 | (2006.01) | |
| G02B 27/09 | (2006.01) | |
| B23K 26/073 | (2006.01) | |
| B23K 26/06 | (2014.01) | |
| H01L 21/20 | (2006.01) | |
| B23K 26/067 | (2006.01) | |
| G02B 19/00 | (2006.01) | |
| G02B 26/10 | (2006.01) | |
| H01L 27/12 | (2006.01) | |

(52) U.S. Cl.
CPC ......... *H01L 21/2026* (2013.01); *H01L 27/1296* (2013.01); *G02B 27/0961* (2013.01); *H01L 27/1285* (2013.01); *B23K 26/0738* (2013.01); *B23K 26/0613* (2013.01); *B23K 26/0676* (2013.01); *G02B 19/0052* (2013.01); *G02B 26/101* (2013.01); *G02B 27/0966* (2013.01); *G02B 19/0014* (2013.01); *Y10S 359/90* (2013.01)
USPC .......................................... 359/623; 359/900

(58) Field of Classification Search
USPC .......................... 359/618, 619, 621, 623, 900
See application file for complete search history.

(56) References Cited

U.S. PATENT DOCUMENTS

| | | |
|---|---|---|
| 4,769,750 A | 9/1988 | Matsumoto et al. |
| 4,951,274 A | 8/1990 | Iwanaga et al. |

(Continued)

FOREIGN PATENT DOCUMENTS

| | | |
|---|---|---|
| EP | 1 400 832 A1 | 3/2004 |
| JP | 06-124913 | 5/1994 |

(Continued)

OTHER PUBLICATIONS

International Search Report (Application No. PCT/JP2006/320986; PCT9121), dated Jan. 16, 2007.

(Continued)

*Primary Examiner* — Jack Dinh
(74) *Attorney, Agent, or Firm* — Nixon Peabody LLP; Jeffrey L. Costellia

(57) ABSTRACT

A deflecting mirror which deflects a laser beam emitted from a laser oscillator, a transfer lens, a cylindrical lens array which divides the laser beam having passed through the transfer lens into a plurality of laser beams, and a condensing lens which superposes the laser beams formed in the cylindrical lens array are included. The following formula is satisfied: $1/f=1/(a+b)+1/c$, when: "a" is a distance between an emission opening of the laser oscillator and the deflecting mirror; "b" is a distance between the deflecting mirror and the transfer lens; "c" is a distance between the transfer lens and an incidence plane of the cylindrical lens array; and "f" is a focal length of the transfer lens.

6 Claims, 17 Drawing Sheets

(56) References Cited

U.S. PATENT DOCUMENTS

| | | | |
|---|---|---|---|
| 5,153,773 | A | 10/1992 | Muraki et al. |
| 5,463,497 | A | 10/1995 | Muraki et al. |
| 5,858,473 | A | 1/1999 | Yamazaki et al. |
| 5,897,799 | A | 4/1999 | Yamazaki et al. |
| 5,900,980 | A | 5/1999 | Yamazaki et al. |
| 5,959,779 | A | 9/1999 | Yamazaki et al. |
| 5,968,383 | A | 10/1999 | Yamazaki et al. |
| 5,986,744 | A | 11/1999 | Kudo et al. |
| 6,002,101 | A | 12/1999 | Yamazaki et al. |
| 6,002,523 | A | 12/1999 | Tanaka |
| 6,038,075 | A | 3/2000 | Yamazaki et al. |
| 6,061,375 | A | 5/2000 | Zhang et al. |
| 6,104,535 | A | 8/2000 | Tanaka |
| 6,137,633 | A | 10/2000 | Tanaka |
| 6,160,827 | A | 12/2000 | Tanaka |
| 6,176,926 | B1 | 1/2001 | Tanaka |
| 6,212,012 | B1 | 4/2001 | Tanaka |
| 6,239,913 | B1 | 5/2001 | Tanaka |
| 6,246,524 | B1 | 6/2001 | Tanaka |
| 6,300,176 | B1 | 10/2001 | Zhang et al. |
| 6,355,940 | B1 | 3/2002 | Koga et al. |
| 6,373,633 | B1 | 4/2002 | Brown |
| 6,392,810 | B1 | 5/2002 | Tanaka |
| 6,393,042 | B1 | 5/2002 | Tanaka |
| 6,440,785 | B1 | 8/2002 | Yamazaki et al. |
| 6,538,819 | B2 | 3/2003 | Tanaka |
| 6,548,370 | B1 | 4/2003 | Kasahara et al. |
| 6,549,267 | B1 | 4/2003 | Kudo |
| 6,563,843 | B1 | 5/2003 | Tanaka |
| 6,567,219 | B1 | 5/2003 | Tanaka |
| 6,573,162 | B2 | 6/2003 | Tanaka et al. |
| 6,707,614 | B2 | 3/2004 | Tanaka |
| 6,728,039 | B2 | 4/2004 | Tanaka |
| 6,738,129 | B2 | 5/2004 | Mizouchi |
| 6,818,568 | B2 | 11/2004 | Tanaka |
| 6,856,630 | B2 | 2/2005 | Tanaka |
| 6,991,975 | B1 | 1/2006 | Yamazaki et al. |
| 7,026,227 | B2 | 4/2006 | Tanaka |
| 7,078,281 | B2 | 7/2006 | Tanaka et al. |
| 7,092,415 | B2 | 8/2006 | Tanaka |
| 7,101,436 | B2 | 9/2006 | Taniguchi et al. |
| 7,112,517 | B2 | 9/2006 | Tanaka et al. |
| 7,135,390 | B2 | 11/2006 | Tanaka |
| 7,245,802 | B2 | 7/2007 | Tanaka |
| 7,259,082 | B2 | 8/2007 | Tanaka |
| 7,372,630 | B2 | 5/2008 | Tanaka |
| 7,418,172 | B2 | 8/2008 | Tanaka et al. |
| 7,450,307 | B2 | 11/2008 | Tanaka et al. |
| 7,479,420 | B2 | 1/2009 | Tanaka |
| 7,594,965 | B2 | 9/2009 | Tanaka |
| 7,595,932 | B2 | 9/2009 | Tanaka et al. |
| 7,674,663 | B2 | 3/2010 | Yamazaki et al. |
| 7,807,944 | B2 | 10/2010 | Akasaka et al. |
| 7,985,635 | B2 | 7/2011 | Yamazaki et al. |
| 8,000,016 | B2 * | 8/2011 | Tanaka et al. ................. 359/623 |
| 2001/0043401 | A1 | 11/2001 | Tanaka |
| 2003/0035219 | A1 | 2/2003 | Tanaka |
| 2003/0042430 | A1 | 3/2003 | Tanaka et al. |
| 2003/0058916 | A1 | 3/2003 | Tanaka et al. |
| 2003/0100169 | A1 | 5/2003 | Tanaka et al. |
| 2003/0117601 | A1 | 6/2003 | Kudo |
| 2003/0143337 | A1 | 7/2003 | Tanaka |
| 2003/0151822 | A1 | 8/2003 | Tanaka |
| 2003/0203602 | A1 | 10/2003 | Tanaka |
| 2004/0058553 | A1 | 3/2004 | Tanaka |
| 2004/0065643 | A1 | 4/2004 | Tanaka |
| 2004/0069751 | A1 | 4/2004 | Yamazaki et al. |
| 2004/0196561 | A1 | 10/2004 | Tanaka |
| 2004/0213514 | A1 | 10/2004 | Tanaka et al. |
| 2005/0031261 | A1 | 2/2005 | Tanaka |
| 2005/0055016 | A1 | 3/2005 | Tanaka et al. |
| 2006/0194377 | A1 | 8/2006 | Yamazaki et al. |

FOREIGN PATENT DOCUMENTS

| | | |
|---|---|---|
| JP | 08-220432 | 8/1996 |
| JP | 09-033852 | 2/1997 |
| JP | 09-288251 | 11/1997 |
| JP | 10-253916 | 9/1998 |
| JP | 11-162868 | 6/1999 |
| JP | 2001-023921 | 1/2001 |
| JP | 2004-119900 | 4/2004 |
| JP | 2005-108987 | 4/2005 |
| JP | 2005-311164 | 11/2005 |

OTHER PUBLICATIONS

Written Opinion (Application No. PCT/JP2006/320986; PCT9121), dated Jan. 16, 2007.

* cited by examiner

Long-side direction of a beam

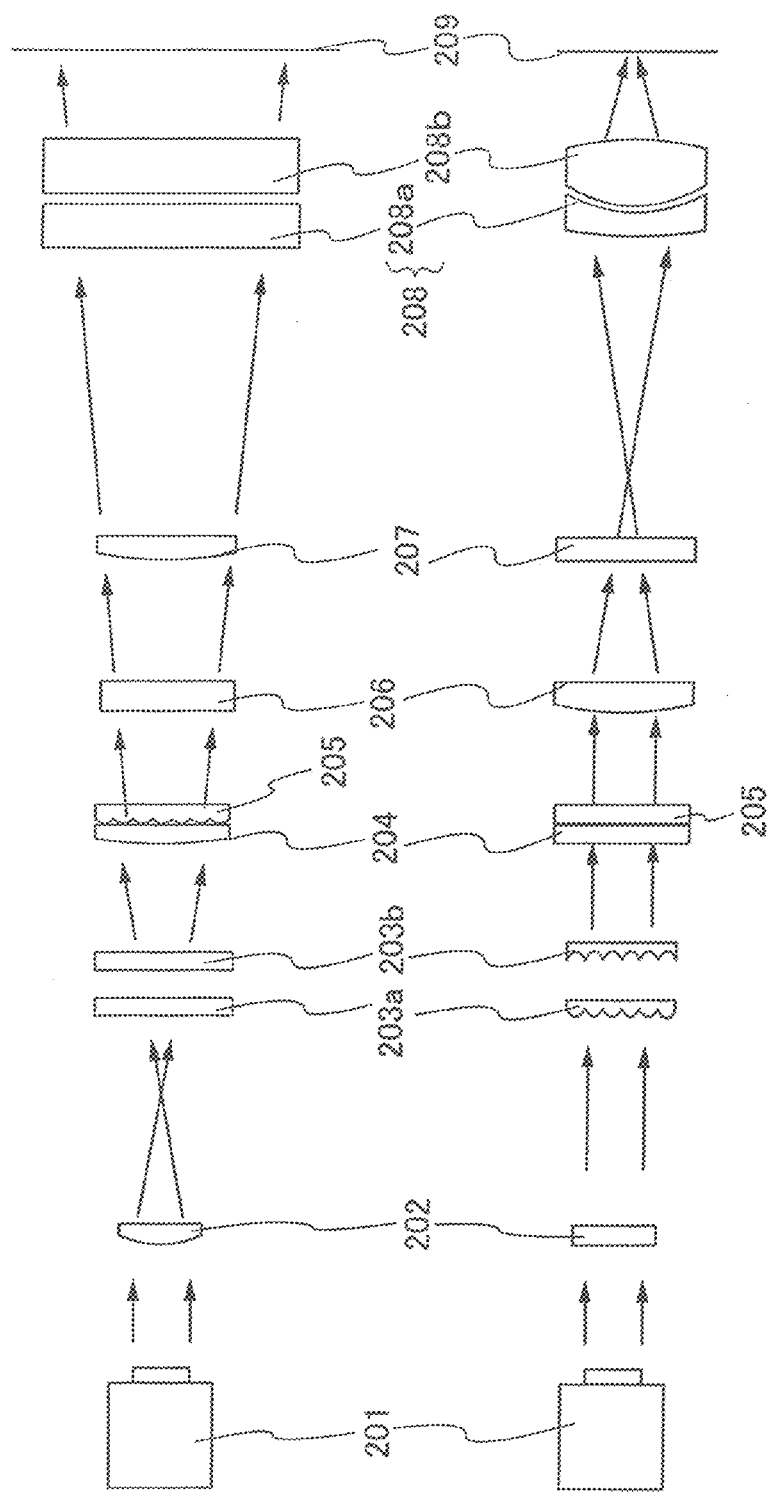

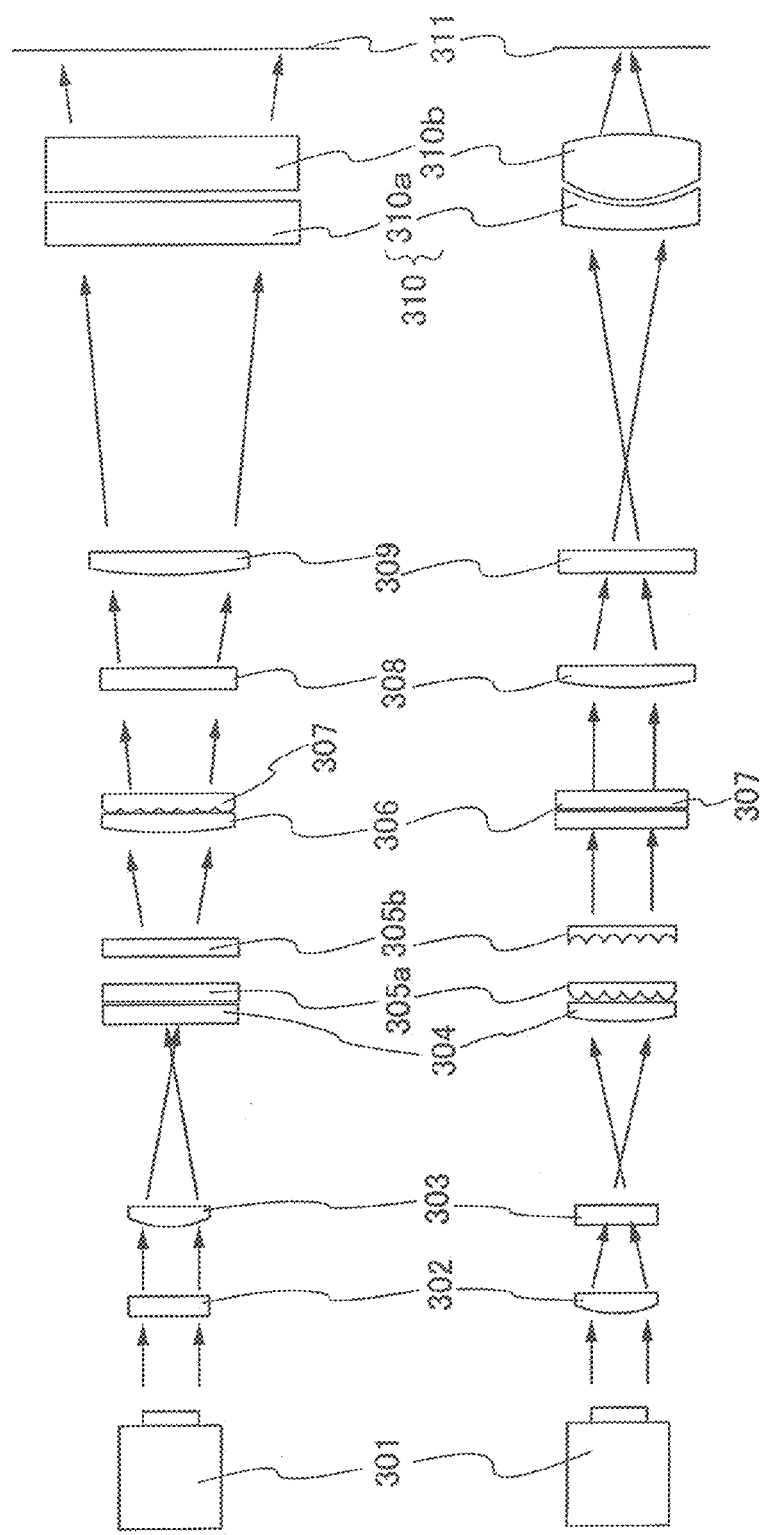

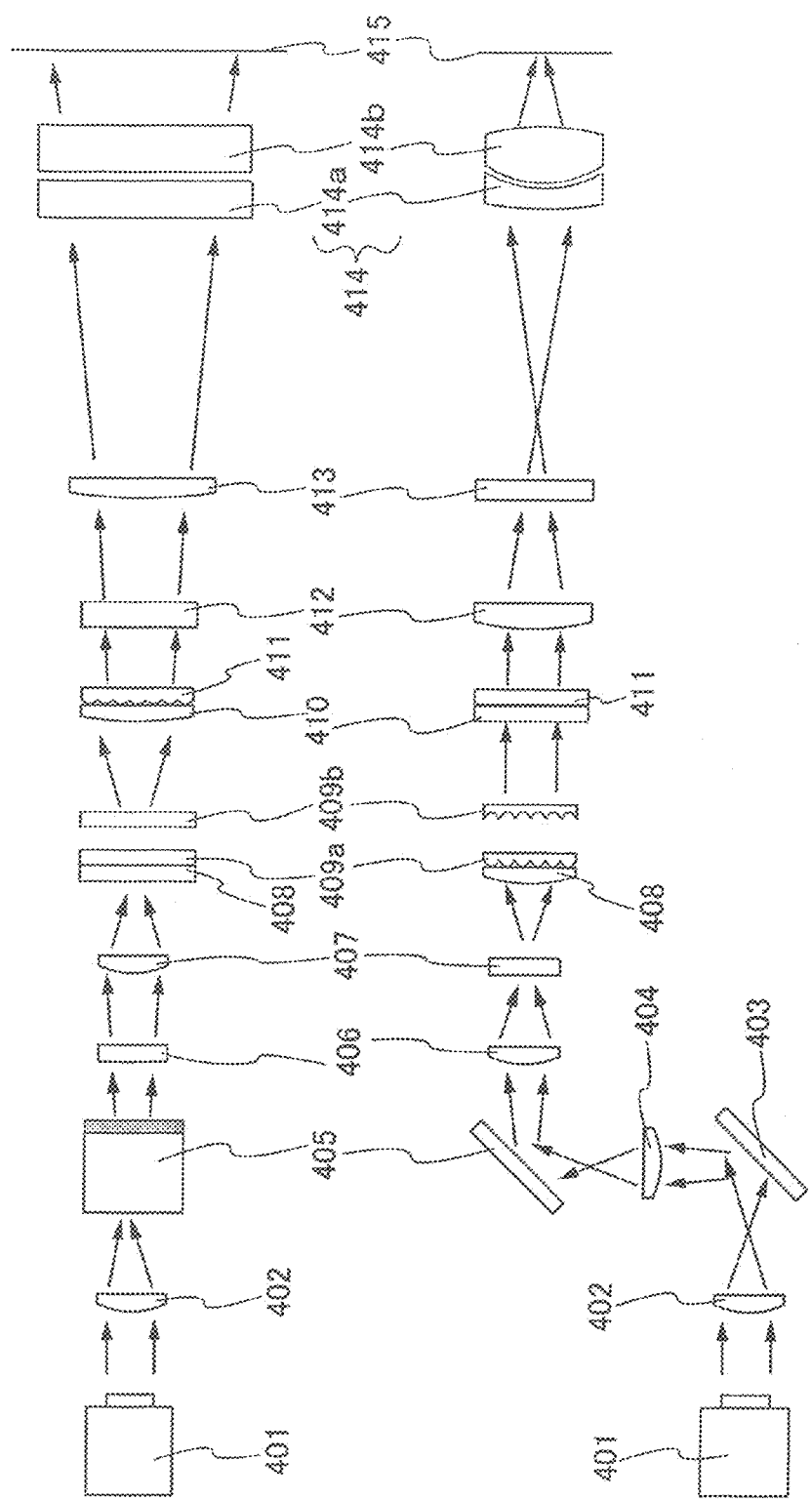

LASER IRRADIATION APPARATUS AND MANUFACTURING METHOD OF SEMICONDUCTOR DEVICE

TECHNICAL FIELD

The present invention relates to a laser irradiation apparatus provided with an optical system which condenses laser beams. In particular, the present invention relates to a laser irradiation apparatus which can irradiate an irradiation surface with a linear beam by using the optical system. Further, the present invention relates to a manufacturing method of a semiconductor device, which uses such a laser irradiation apparatus.

BACKGROUND ART

There is known a technique in which a pulsed excimer laser beam is shaped into a linear laser beam by an optical system and an amorphous silicon film is scanned and irradiated with the linear beam so as to crystallize the amorphous silicon film. This technique is also called excimer laser annealing (ELA).

Excimer laser annealing is advantageous in that crystallization of silicon can be conducted by scanning the silicon with a linear beam without heating a glass substrate over which an amorphous silicon film is formed to high temperature. However, there is a problem in that irradiation unevenness is generated in scanning with a linear beam when an intensity distribution of the linear beam changes. This irradiation unevenness varies a semiconductor characteristic within the substrate. When a display device with a driver and a pixel integrated (system-on-panel) is manufactured using a film having irradiation unevenness, the irradiation unevenness appears directly on the screen of the display device.

In the case of forming a linear beam by a laser irradiation apparatus, a laser beam emitted from a laser oscillator (hereinafter referred to as an "original beam") is generally divided by a cylindrical lens array. Then, the divided laser beams pass through a cylindrical lens to be superposed, and thus a linear laser beam is formed on an irradiation surface. When this linear beam is used to process a semiconductor film, it is required that the linear beam has high homogeneity in which the energy density fluctuates within several %.

However, when this requirement is not satisfied, for example when the linear beam does not have a homogeneous energy distribution in the longitudinal direction, it is difficult to perform laser processing over the entire region in the longitudinal direction within the optimal energy range. Accordingly, it becomes impossible to process the entire surface of the substrate homogeneously, and thus irradiation unevenness occurs.

Homogeneity of a linear beam is affected by an intensity distribution of an original beam. Generally, in order to increase the homogeneity of the linear laser beam, the number of cylindrical lenses constituting a cylindrical lens array is increased so that the original beam is divided into more beams. However, with the increased number of divided beams, the interference between the divided beams becomes more outstanding, which may result in the appearance of an interference fringe on an irradiation surface. Moreover, when a cylindrical lens array is manufactured with cylindrical lenses each having a high aspect ratio between its width and length, enough intensity and lens accuracy are difficult to be achieved; therefore, it is difficult to obtain a desired beam. For this reason, actually, it is difficult to increase the number of divided beams more than a predetermined number in laser irradiation.

In order to overcome such problems, proposed is a laser annealing apparatus which eliminates influences caused by fluctuation of an intensity distribution of an original beam by devising a shape and a structure of cylindrical lenses and which realizes high homogeneity (for example, Reference 1: Japanese Published Patent Application No. H10-253916).

DISCLOSURE OF INVENTION

However, there still remains a problem that the homogeneity of a linear beam in an optical system for forming the linear beam fluctuates when an optical axis is displaced. For example, in order to form a linear beam which is homogeneous on an irradiation surface, it is necessary to optimize an optical system so that the linear beam formed on the irradiation surface has a favorable homogeneity by adjusting an injection position of an original beam in a cylindrical lens array. If an optical axis displacement is generated here, the injection position of the beam is off the optimal position; accordingly, the homogeneity of the linear beam is lowered. At this time, a tolerance of the optical axis displacement of the original beam in terms of homogeneity is considerably small. Thus, the adjustment of the optical system is difficult. Further, when an optical axis displacement is generated after the adjustment of the optical system by shaking or vibration of the apparatus caused by the earthquake or the like, the homogeneity of the linear beam cannot be secured on the irradiation surface.

FIG. 3 schematically shows a laser irradiation apparatus which emits a linear beam. Deflecting mirrors 2001, 2002, and 2003 are disposed in the laser irradiation apparatus. The deflecting mirrors 2001, 2002, and 2003 have functions of deflecting a laser beam emitted from a laser oscillator 2000 by 90 degrees in a plane which is perpendicular to its moving direction and of adjusting an optical axis position of the laser beam. An energy distribution of the laser beam in long and short side directions, which has passed through the deflecting mirrors 2001, 2002, and 2003, is homogenized by a long-side direction forming cylindrical lens array 2004, a short-side direction foaming cylindrical lens array 2005, a long-side direction projecting cylindrical lens 2006, a short-side direction condensing cylindrical lens 2007, and a short-side direction projecting cylindrical lens 2009. After that, a substrate 2011 over a transfer stage 2010 is irradiated with the laser beam. Although the deflecting mirrors have the above-described functions, if a displacement is generated in a fixed angle of the deflecting mirrors disposed in the optical system, a moving direction of the laser beam is displaced; accordingly, an optical axis displacement is caused. Given that a displacement amount of a deflecting mirror is θ, a displacement amount of a deflection angle is represented by 2θ. A slight displacement of the fixed angle greatly fluctuates the moving direction of the beam. Accordingly, an injection position of the laser beam which acts on a cylindrical lens array is displaced, and a predetermined homogeneity of a linear beam cannot be obtained. Note that reference numeral 2008 in FIG. 3 denotes a mirror displaced in order to change a moving direction of the laser beam emitted from the short-side direction condensing cylindrical lens 2007.

In addition, it is found by the present inventors that when a laser beam of both end regions of an original beam acts on a cylindrical lens array, homogeneity of the linear beam on an irradiation surface is rapidly lowered. FIG. 2A shows an example of a typical observed value of an original beam which is emitted from a laser oscillator. FIG. 2A shows an energy distribution of the original beam, and a flat region 3000 whose energy distribution is relatively flat, is formed in a center part of the original beam.

On the other hand, beam end regions 3001 of the original beam have an inhomogeneous energy distribution, in which an intensity distribution fluctuates largely. The case where such an original beam acts on a cylindrical lens will be described with reference to exemplary diagrams of FIGS. 2B and 2C. FIG. 2B shows an example where a cylindrical lens array (the number lenses: 5) acts on only a flat region 2110. In this case, since fluctuation of energy of laser beams which act on each cylindrical lens is small, a homogeneous linear beam can be easily formed by superposing these beams.

FIG. 2C is an exemplary diagram in the case where a cylindrical lens array acts on the flat region 2110 and a beam end region 2111. FIG. 2C shows an example in which the numbers of cylindrical lenses of the flat region 2110 and the beam end region 2111 are four and one respectively. Note in FIGS. 2B and 2C that reference numeral 2112 denotes a width of a cylindrical lens; and 2113, a region on which the cylindrical lens array acts. Here, although an energy distribution of the beam end region 2111 is inhomogeneous, an energy distribution of the flat region 2110 is relatively flat. Thus, an energy distribution which can cover the inhomogeneity of the beam end region 2111 does not exist; accordingly, it is difficult to form a sufficiently homogeneous linear beam on an irradiation surface. Accordingly, when the beam end region 2111 is injected to a cylindrical lens array, it is difficult to homogenize an energy distribution of the laser beam even with the laser annealing apparatus according to Reference 1. In other words, in order to keep the homogeneity of a linear beam high, it is necessary to control an optical axis of the laser beam within a particular range and act a flat region, which has a relatively small energy distribution fluctuation, of an original beam on a cylindrical lens array.

In consideration of such a situation, it is an object of the present invention to prevent a displacement of an injection position of an original beam in a cylindrical lens array by preventing an optical axis displacement of the original beam in forming a linear beam using the cylindrical lens array. It is another object of the present invention to provide a laser irradiation method and a laser irradiation apparatus which can stably form a linear beam with a homogeneous intensity distribution.

The present invention provides a laser irradiation method and a laser irradiation apparatus which can project a linear beam with a homogeneous intensity onto an irradiation surface. One feature of the laser irradiation apparatus is to include a laser oscillator, a transfer lens (also referred to as a relay lens) which transfers a laser beam emitted from the laser oscillator; and a cylindrical lens array which divides the laser beam into a plurality of laser beams. Besides, a condensing lens which superposes the laser beams divided by the cylindrical lens may be provided. It is a gist of a laser irradiation method of the present invention to prevent an optical axis displacement in an optical system, by projecting a laser beam emitted from a laser oscillator onto a cylindrical lens array using a transfer lens.

One feature of a laser irradiation apparatus of the present invention is to include a laser oscillator, a transfer lens which transfers a laser beam emitted from the laser oscillator, a cylindrical lens array which divides the laser beam having passed through the transfer lens into a plurality of laser beams, and a condensing lens which superposes the laser beams formed in the cylindrical lens array.

One feature of a laser irradiation apparatus of the present invention is to include a laser oscillator, a deflecting mirror which deflects a laser beam emitted from the laser oscillator, a transfer lens which transfers the laser beam having been deflected at the deflecting mirror, a cylindrical lens array which divides the laser beam having passed through the transfer lens into a plurality of laser beams, a condensing lens which superposes the laser beams formed in the cylindrical lens array, and a stage over which an irradiation surface for projecting the laser beam having passed through the condensing lens is positioned. In this case, given that "a" is a distance between an emission opening of the laser oscillator and the deflecting mirror; "b" is a distance between the deflecting mirror and the transfer lens; "c" is a distance between the transfer lens and an incidence plane of the cylindrical lens array; and "f" is a focal length of the transfer lens, the following formula (1) is preferably satisfied.

$$\frac{1}{f} = \frac{1}{(a+b)} + \frac{1}{c} \qquad (1)$$

In this manner, in the laser irradiation apparatus of the present invention, the transfer lens is disposed in a position which allows the emission opening of the laser oscillator and the incidence plane of the cylindrical lens array to be conjugated to each other. By this structure, a moving direction of the laser beam which has passed through the transfer lens is corrected; accordingly, a variation in an intensity distribution of the laser beam which is injected to the cylindrical lens array can be suppressed. In other words, an optical axis displacement caused by the displacement of the deflecting mirror in the optical system can be suppressed, and a linear beam with a high homogeneity can be formed on an irradiation surface.

One feature of a laser irradiation apparatus of the present invention is to include a laser oscillator, a first transfer lens which transfers a laser beam emitted from the laser oscillator, a deflecting mirror which deflects the laser beam having passed through the first transfer lens, a second transfer lens which transfers the laser beam having been deflected at the deflecting mirror, a cylindrical lens array which divides the laser beam having passed through the second transfer lens into a plurality of laser beams, a condensing lens which superposes the laser beams formed in the cylindrical lens array, and a stage over which an irradiation surface for projecting the laser beam having passed through the condensing lens is positioned.

In this case, given that "a" is a distance between an emission opening of the laser oscillator and the first transfer lens; "b" is a distance between the first transfer lens and the deflecting mirror; and "$f_1$" is a focal length of the first transfer lens, the following formula (2) is preferably satisfied, and given that "c" is a distance between the deflecting mirror and the second transfer lens; "d" is a distance between the second transfer lens and the cylindrical lens array; and "$f_2$" is a focal length of the second transfer lens, the following formula (3) is preferably satisfied.

$$\frac{1}{f_1} = \frac{1}{a} + \frac{1}{b} \qquad (2)$$

$$\frac{1}{f_2} = \frac{1}{c} + \frac{1}{d} \qquad (3)$$

In this manner, in the laser irradiation apparatus of the present invention, by providing the emission opening of the laser oscillator and the deflecting mirror so as to be conjugated to each other and providing the deflecting mirror and the cylindrical lens array so as to be conjugated to each other, even when a displacement is generated in a fixed angle of the deflecting mirror of an optical system, a moving direction of the laser beam which has passed through the transfer lens can be corrected. Therefore, a variation in an intensity distribution of the laser beam which is injected into the cylindrical lens array can be suppressed. In other words, an optical axis displacement caused by the displacement of the deflecting mirror in the optical system can be suppressed, and a linear beam with a high homogeneity can be formed on an irradiation surface.

One feature of a laser irradiation method of the present invention is to project a laser beam emitted from a laser oscillator onto a cylindrical lens array by using a transfer lens, divide the laser beam into a plurality of laser beams in the cylindrical lens array, and superpose the laser beams formed in the cylindrical lens array by a condensing lens so that irradiation is conducted. In the case of dividing the laser beam emitted from the laser oscillator into the plurality of laser beams in the cylindrical lens array, the laser beam may be projected onto the cylindrical lens array by using a transfer lens provided in a position which allows an emission opening of the laser oscillator and an incidence plane of the cylindrical lens array to be conjugated to each other.

In this manner, in the laser irradiation method of the present invention, an optical axis displacement in an optical system can be suppressed by performing irradiation with the laser beam by effectively using the transfer lens, and a linear beam with a high homogeneity can be formed on an irradiation surface.

One feature of a manufacturing method of a semiconductor device of the present invention is to project a laser beam emitted from a laser oscillator onto a cylindrical lens array by using a transfer lens, divide the laser beam into a plurality of laser beams by using the cylindrical lens array, superposing the laser beams formed in the cylindrical lens array by using a condensing lens, and conduct irradiation so that crystallization is performed or an impurity, which is added into a semiconductor and controls conductivity, is activated. In this case and in the case of dividing the laser beam emitted from the laser oscillator into the plurality of laser beams in the cylindrical lens array, the laser beam may be projected onto the cylindrical lens array by using a transfer lens provided in a position which allows an emission opening of the laser oscillator and an incidence plane of the cylindrical lens array to be conjugated to each other.

In this manner, in the manufacturing method of a semiconductor device of the present invention, by conducting irradiation with the laser beam by efficiently using the transfer lens, an optical axis displacement in an optical system can be prevented, and crystallization or activation can be performed by conducting irradiation with a linear beam with a high homogeneity.

It is to be noted that the emission opening of the laser oscillator refers to a position where a profile of a laser beam to be injected in a cylindrical lens array can be checked in advance, and is a place right after a resonator, where a beam profile fluctuation is small. In this sense, the emission opening of the laser oscillator can be regarded as a laser light source.

When a laser beam has a spread angle, a spreading property of the laser beam, in some cases, shows a behavior of a Gaussian beam. In such a case, in an optical system of the present invention, a beam waist of a Gaussian beam and a cylindrical lens array may be provided so as to be conjugated, instead of providing an emission opening of a laser oscillator and a cylindrical lens array so as to be conjugated. Here, a beam waist of a Gaussian beam is determined by a laser wavelength, a resonant length, a curvature of a resonant mirror, and the like. Therefore, the position of the beam waist is fixed in a roughly constant place in a resonator. In addition, a laser beam can be regarded as being emitted with the position of the beam waist as a reference point. Accordingly, by the above-described structure, an influence of pointing stability of a laser beam can be eased, and a homogeneous linear beam can be formed stably.

A transfer lens is disposed so that a beam emission opening of a laser oscillator and an incidence plane of a cylindrical lens array are conjugated, and a laser beam is projected from the emission opening of the laser oscillator onto the incidence plane of the cylindrical lens array using the transfer lens. Accordingly, even when a displacement is generated in a fixed angle of a deflecting mirror in an optical system, a moving direction of the laser beam which has passed through the transfer lens is corrected. Therefore, a variation in an intensity distribution of a laser beam which acts on the cylindrical lens array can be suppressed.

Accordingly, an optical axis displacement caused by a displacement of a deflecting mirror in an optical system can be suppressed, and a linear beam with a high homogeneity can be Mimed on an irradiation surface. Further, an optical system which is hardly affected by a pointing stability of an original beam can be formed. By such advantageous effects, optical adjustment of the optical system can be conducted easily, and maintenance of a laser irradiation apparatus can also be conducted easily.

BRIEF DESCRIPTION OF DRAWINGS

In the accompanying drawings:

FIGS. 4A and 4B show an optical system of a laser irradiation apparatus disclosed in the present invention;

FIGS. 7A and 7B show an optical system of a laser irradiation apparatus disclosed in the present invention;

FIGS. 8A and 8B show an optical system of a laser irradiation apparatus disclosed in the present invention;

BEST MODE FOR CARRYING OUT THE INVENTION

Embodiment modes and embodiments of the present invention will be described with reference to the drawings. Note that it is easily understood by those skilled in the art that the invention is not limited to the following descriptions, and various changes may be made in forms and details without departing from the spirit and the scope of the invention. Therefore, the invention should not be limited to the descriptions of the embodiment modes and embodiments below.

Figure 1A:
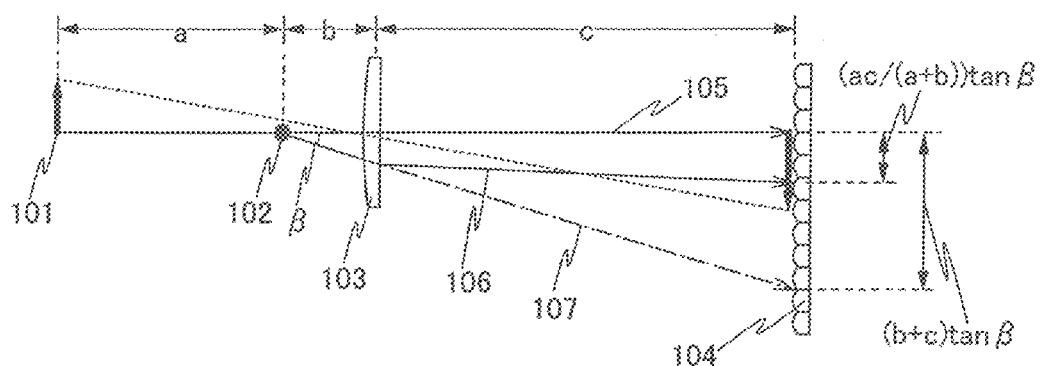
FIGS. 1A and 1B show modes of a laser irradiation apparatus which the present invention discloses.
Figure 1B:
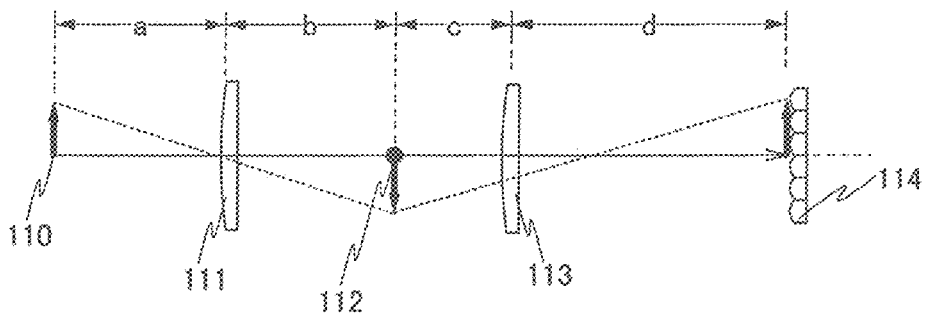
Figure 2A:
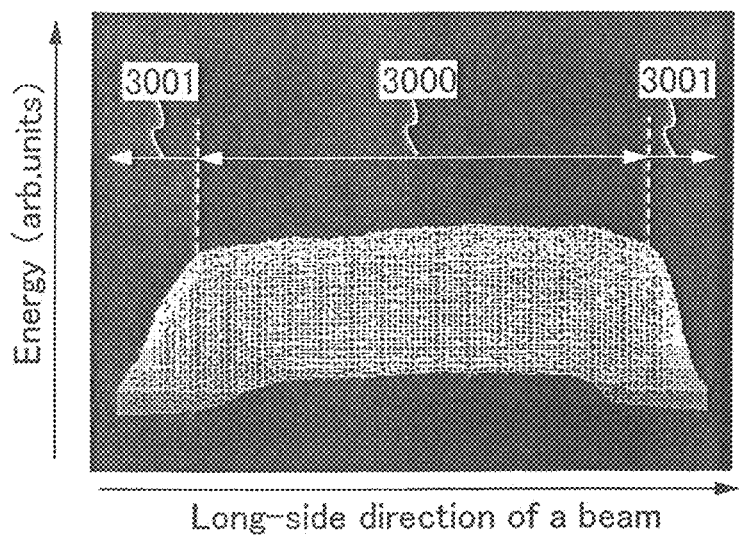
FIGS. 2A to 2C show energy distributions of an original beam and a homogenizing method.
Figure 2B:
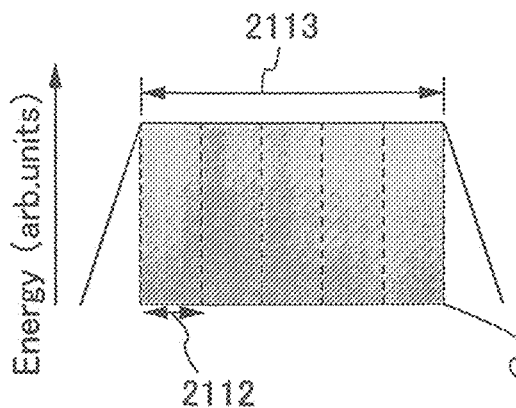
Figure 2C:
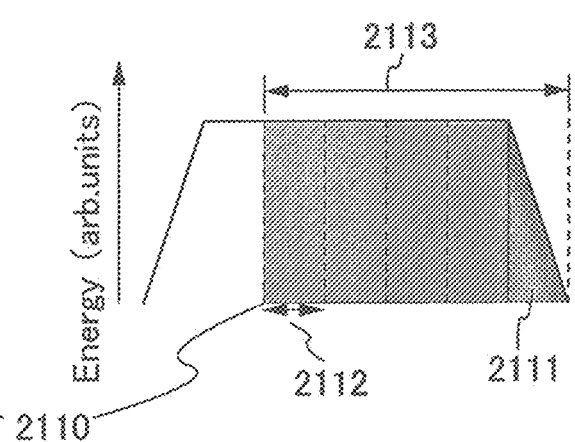
Figure 3:
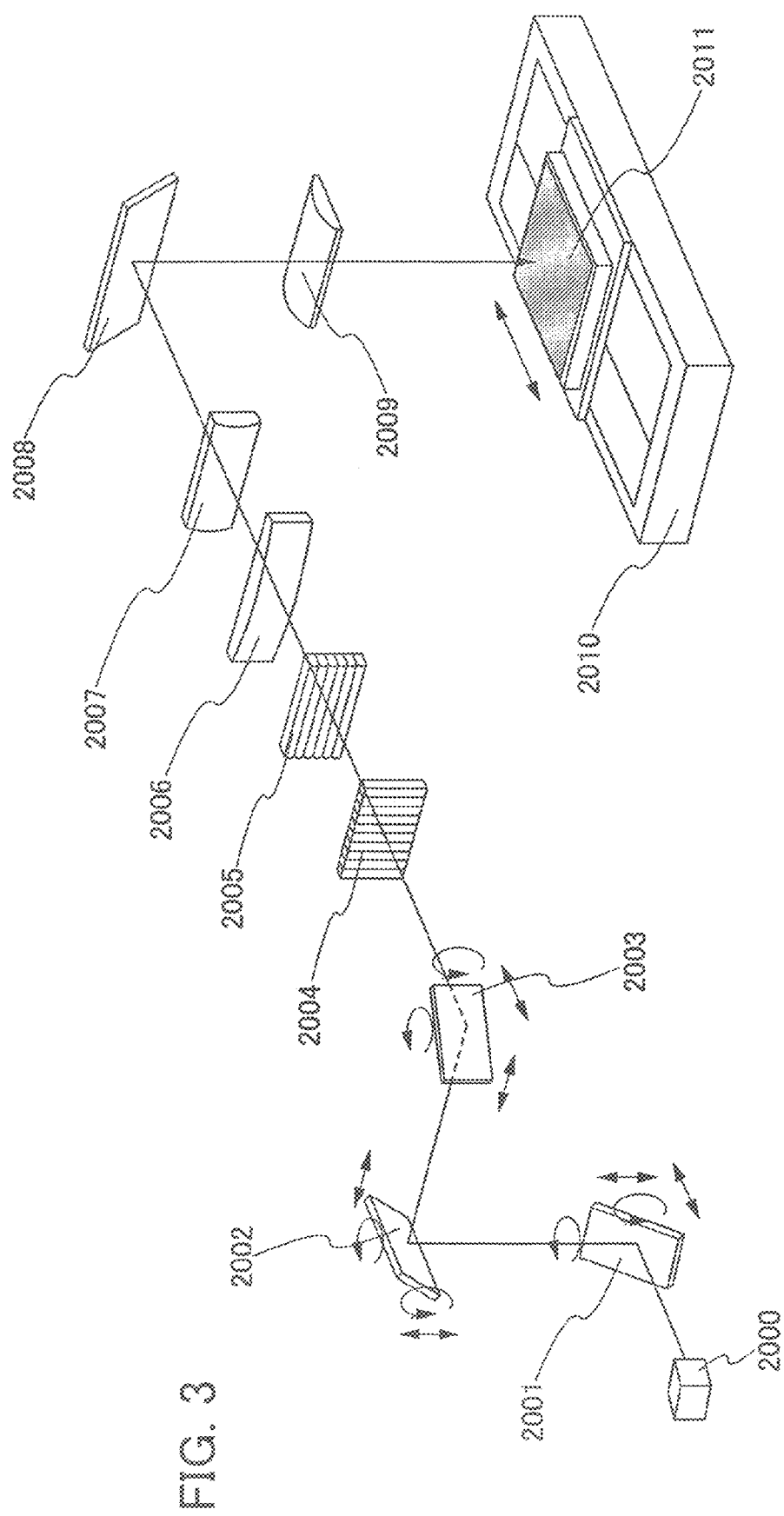
FIG. 3 shows an example of a laser irradiation apparatus.

A laser irradiation apparatus of the present invention has an optical system in which an original beam emitted from a laser oscillator is projected onto an incidence plane of a cylindrical lens array by using a transfer lens. FIGS. 1A and 1B show modes of forming a laser beam in order to solve the above-described problem, and the direction parallel to the paper corresponds to a long side direction of a linear beam.

FIG. 1A shows an optical path of an optical system between the emission of a laser beam from an emission opening 101 of a laser oscillator and the injection of the laser beam into a cylindrical lens array 104. FIG. 1A shows an example of providing one deflecting mirror in the optical system, and a deflecting mirror 102 is disposed. In addition, an optical axis displacement of a laser beam generated by the deflecting mirror 102 is represented by an angle β. In order to suppress the optical axis displacement, a transfer lens 103 is disposed in the optical system.

Here, "a" denotes a distance between the emission opening 101 of the laser oscillator and the deflecting mirror 102; "b", a distance between the deflecting mirror 102 and the transfer lens 103; and "c", a distance between the transfer lens 103 and an incidence plane of the cylindrical lens array 104. A focal length of the transfer lens 103 is denoted by "f". Then, the above-described optical system satisfies the following formula (1). In other words, the transfer lens 103 is provided in a position which allows the emission opening 101 of the laser oscillator and the incidence plane of the cylindrical lens array 104 to be conjugated to each other.

$$\frac{1}{f} = \frac{1}{(a+b)} + \frac{1}{c} \quad (1)$$

In the case where an optical axis displacement is not generated at the deflecting mirror 102, the laser beam goes through an optical path 105 and is injected into the cylindrical lens array 104. Meanwhile, in the case where an angle displacement is generated at the deflecting mirror 102, the laser beam goes through an optical path 106 in the drawing. At this point, if an angle of eccentricity at the deflecting mirror 102 is denoted by β, a displacement amount from the optical path 105 on the incidence plane of the cylindrical lens array 104 can be represented by (ac/(a+b))tan β.

Note that when the angle of eccentricity at the deflecting mirror 102 is denoted by β and the transfer lens 103 is not provided, the laser beam goes through an optical path 107 shown by a dash-dotted line in the drawing. At this point, the displacement amount from the optical path 105 on the incidence plane of the cylindrical lens array 104 can be represented by (b+c)tan β. The value of the displacement amount from the optical path 105 always has the following relation: (ac/(a+b))tan β<(b+c)tan β. Therefore, by providing the transfer lens 103, displacement of the incidence position of the laser beam at the cylindrical lens array 104 can be suppressed regardless of the angle of eccentricity β. Accordingly, an influence of the optical axis displacement can be eased by the transfer lens 103. In order to increase the suppressive effect of the optical axis displacement as much as possible, the following is preferable: a<b or a+b>c. In the actual design of an optical system, an optimal element structure is preferably determined in view of the size of a mirror element and a cylindrical lens array, while taking the above-described formula into consideration. By the above-described structure, the influence of the optical axis displacement caused by the displacement of a deflecting mirror in an optical system can be eased.

Other than the above-described structure, a structure as shown in FIG. 1B can be used, in which a laser beam is transferred from an emission opening 110 of a laser oscillator to a deflecting mirror plane, and further the laser beam is transferred from the deflecting mirror plane to an incidence plane of a cylindrical lens array 114. This structure can also suppress an optical axis displacement of a laser beam even when a displacement is generated in a fixed angle of a deflecting mirror 112. FIG. 1B shows an example of providing one deflecting mirror 112 in an optical system. Here, "a" denotes a distance between the emission opening 110 of the laser oscillator and a transfer lens 111, and "b" denotes a distance between the transfer lens 111 and the deflecting mirror 112. A focal length of the transfer lens 111 is denoted by "$f_1$". Then, the above-described optical system satisfies the following formula (2).

$$\frac{1}{f_1} = \frac{1}{a} + \frac{1}{b} \quad (2)$$

In other words, the emission opening 110 of the laser oscillator and the deflecting mirror 112 are provided so as to be conjugated to each other. In addition, "c" denotes a distance between the deflecting mirror 112 and the transfer lens 113, and "d" denotes a distance between the transfer lens 113 and the cylindrical lens array 114. A focal length of the transfer lens 113 is denoted by "$f_2$". Then, the above-described optical system satisfies the following formula (3).

$$\frac{1}{f_2} = \frac{1}{c} + \frac{1}{d} \quad (3)$$

In other words, the deflecting mirror 112 and the cylindrical lens array 114 are provided so as to be conjugated to each other. By the above-described structure, even when an angle displacement is generated at the deflecting mirror 112, a laser beam can be always injected into a predetermined position of the cylindrical lens array 114.

Note that when a plurality of deflecting mirrors are used in the optical system of FIG. 1A or 1B, a transfer lens may be disposed between the adjacent deflecting mirrors so that two deflecting mirrors are disposed so as to be conjugated. Accordingly, an optical axis displacement between the deflecting mirrors can be solved. In addition, FIGS. 1A and 1B show examples of an optical system which forms a linear beam in a long side direction. However, a structure can be applied, in which transfer lenses acting on a long side direction and a short side direction of a laser beam are prepared, and the laser beam is transferred to a plane of a long-side direction forming cylindrical lens array and a plane of a short-side direction forming cylindrical lens array. By using this structure, an optical axis displacement of a laser beam in a long side direction and a short side direction can be eased at once. In this case, instead of using two kinds of transfer lenses, a toroidal lens, a crossed cylindrical lens, or the like having a projection function in a long side direction and a short side direction in one lens may be used.

In this manner, a beam emission opening of a laser oscillator and an incidence plane of a cylindrical lens array are provided so as to be conjugated, and a laser beam is projected from the emission opening of the laser oscillator onto the incidence plane of the cylindrical lens array using a transfer lens. Accordingly, even when a displacement is generated in a fixed angle of a deflecting mirror in an optical system, a moving direction of the laser beam which has passed through the transfer lens is corrected. Therefore, a variation in an intensity distribution of a laser beam which acts on the cylindrical lens array can be suppressed.

When a laser beam emitted from a laser oscillator has a spread angle, a spreading property of the laser beam, in some cases, shows a behavior of a Gaussian beam. In such a case, in an optical system of the present invention, a beam waist of a Gaussian beam and a cylindrical lens array may be provided so as to be conjugated, instead of disposing an emission opening of a laser oscillator and a cylindrical lens array so as to be conjugated. Here, a beam waist of a Gaussian beam is determined by a laser wavelength, a resonant length, a curvature of a resonant mirror, and the like. Therefore, the position of the beam waist is fixed in a roughly constant place in a resonator. In addition, a laser beam can be regarded as being emitted with the position of the beam waist as a reference point. Accordingly, by the above-described structure, an influence of pointing stability of a laser beam can be eased, and a homogeneous linear beam can be formed stably.

Embodiment Mode 1

Hereinafter, a mode of a laser irradiation apparatus of the present invention will be further specifically described with reference to FIGS. 4A and 4B. Here, an example of an optical system which prevents an optical axis displacement of a linear beam in a long side direction will be described. In addition, an optical system for forming a laser beam emitted from a laser oscillator into a beam spot with a diameter of 150 mm will be described. However, the present invention is not limited to the beam spot with a diameter of 150 mm, and can be similarly applied to both the case of a beam spot with a diameter longer than 150 mm and the case of a beam spot with a diameter shorter than 150 mm.

Note in this specification that the disposition of lenses is described assuming a moving direction of a laser beam as the front. In a lens, an incidence side of a laser beam is referred to as a first plane, and an emission side of a laser beam is referred to as a second plane. In addition, the sign of a radius of curvature is negative when a center of curvature is on an incidence side of the laser beam with respect to the lens and positive when the center of curvature is on an emission side of the laser beam with respect to the lens. When the surface is plane, the sign is ∞. Moreover, all the lenses to be used are made of synthetic quartz glass (refractive index 1.485634); however the present invention is not limited to this. The lenses can be applied to various lasers by changing a coating material on the surface of the synthetic quartz glass in accordance with the wavelength of the laser.

A side view of FIG. 4B is described. A laser beam emitted from a laser oscillator 201 travels in a direction indicated by an arrow in FIGS. 4A and 4B, and a beam spot of the laser beam is divided in a short side direction by short-side direction forming cylindrical lens arrays 203a and 203b. The short-side direction forming cylindrical lens array 203a has six cylindrical lenses arranged in a direction of its curvature, each of which has a thickness of 5 mm, a width of 3.5 mm, and a first plane with a radius of curvature of +146 mm. The short-side direction forming cylindrical lens array 203b has six cylindrical lenses arranged in a direction of its curvature, each of which has a thickness of 5 mm, a width of 3.5 mm, and a first plane with a radius of curvature of −219 mm. The short-side direction forming cylindrical lens array 203a is provided at 2,667 mm from an irradiation surface 209, and the distance between the short-side direction forming cylindrical lens arrays 203a and 203b is set 510 mm.

After that, the laser beams having passed through the short-side direction forming cylindrical lens arrays 203a and 203b are superposed in one place by using a condensing lens. In this embodiment mode, the laser beams are condensed by a short-side direction condensing cylindrical lens 206. The short-side direction condensing cylindrical lens 206 is placed at 265 mm from the short-side direction forming cylindrical lens array 203b on the irradiation surface side, and has a thickness of 20 mm and a first plane with a radius of curvature of +194 mm. By superposing the laser beams which have passed through the short-side direction forming cylindrical lens arrays 203a and 203b in one place, an energy distribution of the beam spot in a short side direction can be homogenized, and a beam with the homogeneous plane formed can be projected onto the irradiation surface 209; accordingly, a beam spot having a homogeneous energy distribution can be formed. In order to project the beam, a doublet cylindrical lens 208, which is a short-side direction projecting cylindrical lens, is disposed at 1,650 mm from the short-side direction condensing cylindrical lens 206 on the irradiation surface side. Here, the doublet cylindrical lens is a lens including two cylindrical lenses. The above-described doublet cylindrical lens 208 includes a cylindrical lens 208a and a cylindrical lens 208b. The cylindrical lens 208a has a thickness of 8 mm, a first plane with a radius of curvature of +125 mm, and a second plane with a radius of curvature of +47 mm. The cylindrical lens 208b has a thickness of 20 mm, a first plane with a radius of curvature of +52 mm, and a second plane with a radius of curvature of −200 mm. The distance between the two cylindrical lenses 208a and 208b is 5.5 mm. This makes it possible to homogenize an energy distribution of the beam spot of the laser beam in a short side direction and determine the length in a short side direction. The doublet cylindrical lens 208 is not necessarily used; however, a space can be secured by using the doublet cylindrical lens 208 because enough distance can be obtained between the optical system and the irradiation surface. The beam is projected onto the irradiation surface 209 disposed at 204 mm from the doublet cylindrical lens 208 on the irradiation surface side. Thus, a beam having a homogeneous energy distribution in a short side direction can be formed.

Next, a plane view of FIG. 4A is described. A laser beam emitted from the laser oscillator 201 passes through a long-side direction transferring cylindrical lens 202 which serves as a transfer lens. The long-side direction transferring cylindrical lens 202 is disposed so that an emission opening of the laser oscillator 201 and a long-side direction forming cylindrical lens array 205 are conjugated. The long-side direction transferring cylindrical lens 202 has a first plane with a radius of curvature of +150 mm, and is disposed at 600 mm from the emission opening of the laser oscillator 201 on the irradiation surface side. Here, a deflecting mirror, although not shown, is provided between the laser oscillator 201 and the long-side direction transferring cylindrical lens 202. The deflecting mirror is provided so as to adjust an optical path of a laser beam and optimize an energy distribution of a linear beam on the irradiation surface 209. However, when a displacement is generated in a fixed angle of the deflecting mirror, a moving direction of the laser beam changes. By using the above-described structure, it is possible to control the displacement of the moving direction of the beam, which is generated by the deflecting mirror; accordingly, a laser beam can be injected into a predetermined position in the long-side direction forming cylindrical lens array 205.

A long-side direction angle correcting cylindrical lens 204 is provided in the present optical system so as to correct a spread angle of a laser beam. The long-side direction angle correcting cylindrical lens 204 is disposed just before the long-side direction forming cylindrical lens array 205. A curvature of the long-side direction angle correcting cylindrical lens 204 is preferably set at the same level as that of the long-side direction transferring cylindrical lens 202, so as to collimate laser beams. In this embodiment mode, a radius of curvature of a first plane of the long-side direction angle correcting cylindrical lens 204 is set +150 mm.

Further, the beam spot is divided in a long side direction by the long-side direction forming cylindrical lens array 205. After that, the divided laser beams are synthesized into one on the irradiation surface 209 by using a long-side direction projecting cylindrical lens 207 which is disposed at 425 mm from the long-side direction forming cylindrical lens array 205 on the irradiation surface side and has a thickness of 20 mm and a first plane with a radius of curvature of +800 mm. Accordingly, an energy distribution of the beam spot of the laser beam in a long side direction is homogenized, and the length in a long side direction is determined.

Figure 5A:
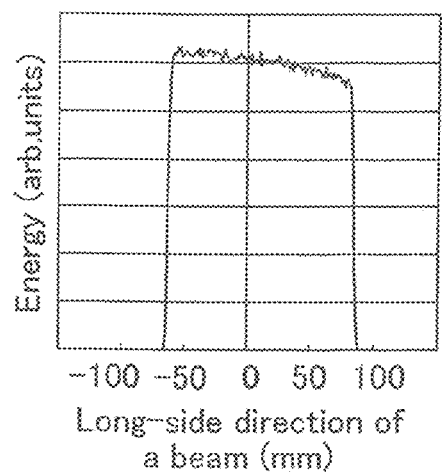
FIGS. 5A and 5B show examples of an energy distribution of a linear beam.
Figure 5B:
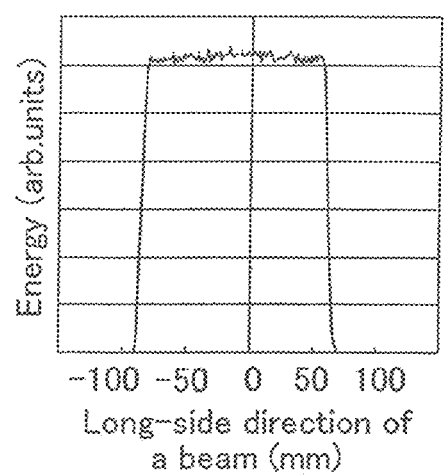

Here, FIGS. 5A and 5B show results obtained by investigating an energy distribution of a linear beam in a long side direction, which is formed on the irradiation surface 209, using an electronic calculator. FIGS. 5A and 5B show examples in the case where, in the optical system of FIGS. 4A and 4B, a deflecting mirror is disposed at an intermediate position between the laser oscillator 201 and the long-side direction transferring cylindrical lens 202 and an angle displacement at the deflecting mirror is 0.4°. FIG. 5A shows an energy distribution obtained in the case where the long-side direction transferring cylindrical lens 202 is not provided. In such a case, since an influence of the axis displacement is not eased, the energy distribution of a linear beam is not homogeneous. On the other hand, FIG. 5B shows an energy distribution obtained by using an optical system of the present invention. It can be found that a linear beam with favorable homogeneity is obtained because the axis displacement is corrected by the present optical system.

Figure 6:
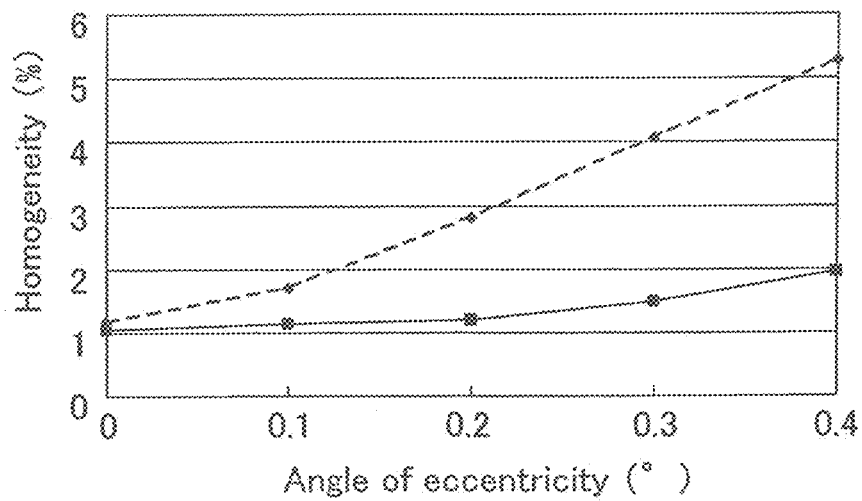
FIG. 6 shows an example of a homogeneity fluctuation of a linear beam.

FIG. 6 shows a result obtained by calculating a variation in homogeneity of the linear beam. In FIG. 6, the horizontal axis indicates an angle of eccentricity at the deflecting mirror, and the vertical axis indicates a homogeneity of the linear beam. The homogeneity is a range of a fluctuation with respect to an average value of intensity of the linear beam in a long side direction. Here, a dotted line in FIG. 6 represents a result obtained in the case where the long-side direction transferring cylindrical lens 202 is not provided. From this result, it can be found that homogeneity is rapidly lowered when an angle of eccentricity increases. On the other hand, a solid line in FIG. 6 represents homogeneity of a linear beam obtained by using an optical system of the present invention, and it can be found that the variation of the homogeneity is smaller in a wide angle region. Accordingly, by providing the long-side direction transferring cylindrical lens 202, an angle displacement at the deflecting mirror is corrected, and favorable homogeneity of the linear beam can be kept.

Although the beam spot whose shape is linear on the irradiation surface is used in this embodiment mode, the present invention is not limited to the linear beam. For example, the short-side direction forming cylindrical lens arrays 203a and 203b have a function of reducing the size of the laser beam in a short-side direction in FIGS. 4A and 4B. However, if the short-side direction forming cylindrical lens array 203b is removed, the laser beam is not reduced in size; therefore, a beam spot having a lower aspect ratio than the beam spot formed by the optical system shown in FIGS. 4A and 4B is formed. The shape of the laser beam emitted from the laser varies depending on the kind of lasers, and the beam spot shaped by the optical system is easily affected by the original shape. For example, a laser beam emitted from a XeCl excimer laser (wavelength 308 nm, a pulse width 30 ns) has a rectangular shape with a size of 10 mm×30 mm (both are a full width at half maximum in a beam profile). A laser beam emitted from a solid-state laser is circular when the rod shape is cylindrical and the laser beam is rectangular when the rod shape is slab. In any case, there is no problem when the laser beam has an enough energy density to anneal an irradiation object, and the present invention can be applied.

As the laser oscillator used in a laser irradiation apparatus of the present invention, a laser oscillator having high output power and a wavelength range which is sufficiently absorbed in a semiconductor film is preferable. In the case of using a silicon film as a semiconductor film, it is preferable that the wavelength of the laser beam emitted from the laser oscillator be 600 nm or shorter in consideration of an absorption rate. As the laser oscillator emitting such a laser beam, for example, an excimer laser, a YAG laser (harmonic), a glass laser (harmonic), and the like are given. Further, a $YVO_4$ laser (harmonic), a YLF laser (harmonic), an Ar laser, and the like are given as laser oscillators for emitting laser beams with wavelengths appropriate for the crystallization of a silicon film.

Next, a case of manufacturing a semiconductor device is described as a mode of using a laser irradiation apparatus of the present invention. First, a glass substrate having a size of 600 mm×720 mm×0.7 mm is prepared. A substrate having enough resistance against heat up to 600° C. is used as this glass substrate. Over the glass substrate, a silicon oxide film with a thickness of 200 nm is formed as a base film. Further, an amorphous silicon film is Mimed thereover in 55 nm thick. The base film and the amorphous silicon film are formed by a sputtering method or a plasma CVD method.

The substrate where the films have been formed is heated in a nitrogen atmosphere at 450° C. for one hour. This step is to decrease a hydrogen concentration in the amorphous silicon film. This step is conducted because the amorphous silicon film cannot resist a laser energy when the amorphous silicon film contains too much hydrogen.

The hydrogen concentration of the amorphous silicon film is appropriately $1\times10^{20}/cm^3$ to $1\times10^{22}/cm^3$. Here, $1\times10^{20}/c$ means that $1\times10^{20}$ number of hydrogen atoms exist in 1 $cm^3$.

In a specific example of the present manufacturing method, STEEL 1000 (XeCl excimer laser) manufactured by Lambda Physik, Inc. is used as a laser oscillator. This excimer laser is a pulsed laser oscillator having a maximum energy of 1,000 mJ per pulse, an emission wavelength of 308 nm, and a maximum repetition rate of 300 Hz. It is possible to perform homogeneous crystallization, when the energy of the pulsed laser beam fluctuates within ±5%, preferably within ±2%, in each pulse during the laser processing performed to one substrate. The fluctuation of the laser energy described here is defined as follows. An average value of the laser energy in a period of the irradiation to one substrate is assumed to be a reference. Then, the fluctuation of the laser energy is defined as a value expressing a difference between the average value and the maximum or minimum value in the period of the irradiation in percentage terms.

For example, the irradiation surface 209 shown in FIGS. 4A and 4B is irradiated with a laser beam while a stage over which an irradiation subject is placed is moved in a short side direction of a rectangular beam spot. At the laser irradiation, process conditions such as an energy density of the beam spot on the irradiation surface and the scanning speed may be appropriately determined by a practitioner. It is feasible to perform laser annealing homogeneously, when the energy density is appropriately selected from a range of 300 to 1,000 mJ/cm$^2$, and the scanning speed is appropriately selected from the range where widths of the rectangular beam spots in a short side direction are overlapped one another by approximately 90% or more. The optimum scanning speed depends on a repetition rate of the laser oscillator, and may be regarded to be proportional to the repetition rate.

By performing the process as above, the laser annealing step is completed. By repeating this step, many substrates can be processed. The substrate processed thus can be utilized to manufacture an active matrix liquid crystal display and an EL display. The above-described manufacturing method uses an excimer laser as the laser oscillator. Since the excimer laser has a coherent length as short as several μm, the excimer laser is suitable for the optical system in the above-described example.

Although some of the lasers shown below have long coherent lengths, a laser whose coherent length is changed deliberately may be employed. It is also preferable to use a harmonic of a YAG laser or a harmonic of a glass laser because they also have high output power and energy which is sufficiently absorbed in a silicon film. As a laser oscillator appropriate for the crystallization of a silicon film, a YVO$_4$ laser (harmonic), a YLF laser (harmonic), an Ar laser, and the like are given. The wavelengths of these laser beams are sufficiently absorbed in the silicon film.

The specific example in the above-described manufacturing method of a semiconductor device uses the amorphous silicon film as a non-single crystal semiconductor film. However, it is easily supposed that the present invention can be applied to other non-single crystal semiconductor films. For example, a compound semiconductor film having an amorphous structure such as an amorphous silicon germanium film may be used as the non-single crystal semiconductor film. Further, a polycrystalline silicon film may be used as the non-single crystal semiconductor film.

According to this embodiment mode, a transfer lens is provided in a position which allows a beam emission opening of a laser oscillator and an incidence plane of a cylindrical lens array to be conjugated. By the transfer lens, a laser beam is projected onto the incidence plane of the cylindrical lens array from the emission opening of the laser oscillator. Accordingly, even when a displacement is generated in a fixed angle of a deflecting mirror of an optical system, a moving direction of the laser beam which has passed through the transfer lens is corrected. Therefore, a variation in an intensity distribution of a laser beam which acts on the cylindrical lens array can be suppressed. Accordingly, an optical axis displacement caused by the displacement of the deflecting mirror in the optical system can be suppressed, and a linear beam with a high homogeneity can be formed on an irradiation surface.

Embodiment Mode 2

Embodiment Mode 2 will describe an optical system used in a laser irradiation apparatus of the present invention, which is different from the optical system described in Embodiment Mode 1. FIGS. 7A and 7B show an example of an optical system which is formed by adding a function of correcting an optical axis displacement in a short axis direction to the optical system described in Embodiment Mode 1.

First, a side view of FIG. 7B is described. A laser beam emitted from a laser oscillator 301 passes through a short-side direction transferring cylindrical lens 302. The short-side direction transferring cylindrical lens 302 is disposed so that an emission opening of the laser oscillator 301 and a short-side direction forming cylindrical lens array 305a are conjugated. The short-side direction transferring cylindrical lens 302 has a first plane with a radius of curvature of +80 mm, and is provided at 320 mm from the emission opening of the laser oscillator 301 on the irradiation surface side. Here, a deflecting mirror, although not shown, is provided between the laser oscillator 301 and the short-side direction transferring cylindrical lens 302. The deflecting mirror is provided so as to adjust an optical path of the laser beam and optimize an energy distribution of a linear beam on an irradiation surface 311. However, when a displacement is generated in a fixed angle of the deflecting mirror, a moving direction of the laser beam changes. By using the above-described structure, it is possible to control the displacement of the moving direction of the beam, which is generated by the deflecting mirror.

A short-side direction angle correcting cylindrical lens 304 is provided in the present optical system so as to correct a spread angle of a laser beam. The short-side direction angle correcting cylindrical lens 304 is disposed just before the short-side direction forming cylindrical lens array 305a. A curvature of the short-side direction angle correcting cylindrical lens 304 is preferably set at the same level as that of the short-side direction transferring cylindrical lens 302, so as to collimate laser beams. In this embodiment mode, a radius of curvature of a first plane of the short-side direction angle correcting cylindrical lens 304 is set +80 mm. Further, a beam spot of the laser beam is divided in a short side direction by short-side direction forming cylindrical lens arrays 305a and 305b. The short-side direction forming cylindrical lens array 305a has six cylindrical lenses arranged in a direction of its curvature, each of which has a thickness of 5 mm, a width of 3.5 mm, and a first plane with a radius of curvature of +146 mm. The short-side direction forming cylindrical lens array 305b has six cylindrical lenses arranged in a direction of its curvature, each of which has a thickness of 5 mm, a width of 3.5 mm, and a first plane with a radius of curvature of −219 mm. The short-side direction forming cylindrical lens array 305a is provided at 2,667 mm from the irradiation surface 311, and a distance between the short-side direction forming cylindrical lens arrays 305a and 305b is set 510 mm.

After that, the laser beams having passed through each cylindrical lens array are superposed in one place by using a condensing lens. In this embodiment mode, the laser beams are condensed by a short-side direction condensing cylindrical lens 308. The short-side direction condensing cylindrical lens 308 is placed at 265 mm from the short-side direction forming cylindrical lens array 305b on the irradiation surface side, and has a thickness of 20 mm and a first plane with a radius of curvature of +194 mm. By superposing the laser beams which have passed through each cylindrical lens array in one place, an energy distribution of the beam spot in a short side direction can be homogenized, and a beam with the homogeneous plane formed can be projected onto the irradiation surface 311; accordingly, a beam spot having homogeneous energy distribution can be formed. In order to project the beam, a doublet cylindrical lens 310, which is a short-side direction projecting cylindrical lens, is disposed at 1,650 mm from the short-side direction condensing cylindrical lens 308 on the irradiation surface side. Here, the doublet cylindrical lens is a lens including two cylindrical lenses. The above-described doublet cylindrical lens 310 includes a cylindrical lens 310a and a cylindrical lens 310b. The cylindrical lens 310a has a thickness of 8 mm, a first plane with a radius of curvature of +125 mm, and a second plane with a radius of curvature of +47 mm. The cylindrical lens 310b has a thickness of 20 mm, a first plane with a radius of curvature of +52 mm, and a second plane with a radius of curvature of −200 mm. The distance between the two cylindrical lenses 310a and 310b is 5.5 mm. This makes it possible to homogenize the energy distribution of the beam spot of the laser beam in a short side direction and determine the length in a short side direction. The doublet cylindrical lens 310 is not necessarily used; however, a space can be secured by using the doublet cylindrical lens 310 because enough distance can be obtained between the optical system and the irradiation surface 311. The beam is projected onto the irradiation surface 311 disposed at 204 mm from the doublet cylindrical lens 310 on the irradiation surface side. Thus, a beam having a homogeneous energy distribution in a short side direction can be formed.

Next, a plane view of FIG. 7A is described. The laser beam emitted from the laser oscillator 301 passes through the long-side direction transferring cylindrical lens 303. The long-side direction transferring cylindrical lens 303 is disposed so that the emission opening of the laser oscillator 301 and a long-side direction forming cylindrical lens array 307 are conjugated. The long-side direction transferring cylindrical lens 303 has a first plane with a radius of curvature of +150 mm, and disposed at 600 mm from the emission opening of the laser oscillator 301 on the irradiation surface side.

A long-side direction angle correcting cylindrical lens 306 is provided in the present optical system so as to correct a spread angle of a laser beam. The long-side direction angle correcting cylindrical lens 306 is disposed just before the long-side direction forming cylindrical lens array 307. A curvature of the long-side direction angle correcting cylindrical lens 306 is preferably set at the same level as that of the long-side direction transferring cylindrical lens 303, so as to collimate laser beams. In this embodiment mode, a radius of curvature of a first plane of the long-side direction angle correcting cylindrical lens 306 is set +150 mm.

Further, the beam spot is divided in a long side direction by the long-side direction forming cylindrical lens array 307. After that, the divided laser beams are synthesized into one on the irradiation surface 311 by using a long-side direction projecting cylindrical lens 309 which is disposed at 425 mm from the long-side direction forming cylindrical lens array 307 on the irradiation surface side and has a thickness of 20 mm and a first plane with a radius of curvature of +800 mm. Accordingly, an energy distribution of the beam spot of the laser beam in a long side direction is homogenized, and the length in a long side direction is determined.

According to this embodiment mode, a transfer lens is provided in a position which allows a beam emission opening of a laser oscillator and an incidence plane of a cylindrical lens array to be conjugated. By the transfer lens, a laser beam is projected onto the incidence plane of the cylindrical lens array from the emission opening of the laser oscillator. Accordingly, even when a displacement is generated in a fixed angle of a deflecting mirror of an optical system, a moving direction of the laser beam which has passed through the transfer lens is corrected. Therefore, a variation in an intensity distribution of a laser beam which acts on the cylindrical lens array can be suppressed. Accordingly, an optical axis displacement caused by the displacement of the deflecting mirror in the optical system can be suppressed, and a linear beam with a high homogeneity can be formed on an irradiation surface.

Embodiment Mode 3

Embodiment Mode 3 will describe an optical system used in a laser irradiation apparatus of the present invention, which is different from the optical systems described in Embodiment Mode 1 and 2. FIGS. 8A and 8B show an example of an optical system which transfers a laser beam emitted from a laser oscillator to a plane of a deflecting mirror.

First, a side view of FIG. 8B is described. A laser beam emitted from a laser oscillator 401 is injected into a transfer lens 402. The transfer lens 402 has a first plane with a radius of curvature of +80 mm. A distance between the laser oscillator 401 and a deflecting lens 403 is 640 mm, and the transfer lens 402 is provided in a position which allows the laser oscillator 401 and the deflecting mirror 403 to be conjugated. Accordingly, a laser beam is projected onto the deflecting mirror 403 from an emission opening of the laser oscillator 401. Further, the laser beam whose moving direction is deflected by the deflecting mirror 403 is injected into a transfer lens 404. The transfer lens 404 has a first plane with a radius of curvature of +80 mm. In addition, a distance between the deflecting mirror 403 and a deflecting mirror 405 is 640 mm, and the transfer lens 404 is provided in a position which allows the deflecting mirror 403 and the deflecting mirror 405 to be conjugated. Thus, the laser beam is projected from the deflecting mirror 403 onto the deflecting mirror 405. By the above-described structure, an optical axis displacement caused by a displacement of a deflecting mirror can be corrected, and a laser beam can be injected to a particular place on the deflecting mirror. Further, the laser beam whose moving direction is deflected by the deflecting mirror 405 passes through a short-side direction transferring cylindrical lens 406. The short-side direction transferring cylindrical lens 406 serving as a transfer lens is displaced so that the deflecting mirror 405 and a short-side direction forming cylindrical lens array 409a are conjugated. The short-side direction transferring cylindrical lens 406 has a first plane with a radius of curvature of +80 mm, and is disposed at 320 mm from the deflecting mirror 405 on the irradiation surface side. Since a displacement of the moving direction of the beam generated by the deflecting mirror 405 can be suppressed by the above-described structure, a laser beam can be injected to a predetermined position in the short-side direction forming cylindrical lens array 409a.

A short-side direction angle correcting cylindrical lens 408 is provided in the present optical system so as to correct a spread angle of a laser beam. The short-side direction angle correcting cylindrical lens 408 is disposed just before the short-side direction forming cylindrical lens array 409a. A curvature of the short-side direction angle correcting cylindrical lens 408 is preferably set at the same level as that of the short-side direction transferring cylindrical lens 406, so as to collimate laser beams. In this embodiment mode, a radius of curvature of a first plane of the short-side direction angle correcting cylindrical lens 408 is set +80 mm. Further, a beam spot of the laser beam is divided in a short side direction by the short-side direction forming cylindrical lens array 409a and a short-side direction forming cylindrical lens array 409b. The short-side direction forming cylindrical lens array 409a has six cylindrical lenses arranged in a direction of its curvature, each of which has a thickness of 5 mm, a width of 3.5 mm, and a first plane with a radius of curvature of +146 mm. The short-side direction forming cylindrical lens array 409b has six cylindrical lenses arranged in a direction of its curvature, each of which has a thickness of 5 mm, a width of 3.5 mm, and a first plane with a radius of curvature of −219 mm. The short-side direction forming cylindrical lens array 409a is provided at 2,667 mm from the irradiation surface 415, and a distance between the short-side direction forming cylindrical lens arrays 409a and 409b is set 510 mm.

After that, the laser beams having passed through each cylindrical lens array are superposed in one place by using a condensing lens. In this embodiment mode, the laser beams are condensed by a short-side direction condensing cylindrical lens 412. The short-side direction condensing cylindrical lens 412 is placed at 265 mm from the short-side direction forming cylindrical lens array 409b on the irradiation surface side, and has a thickness of 20 mm and a first plane with a radius of curvature of +194 mm. By superposing the laser beams which have passed through each cylindrical lens array in one place, an energy distribution of the beam spot in a short side direction can be homogenized, and a beam with the homogeneous plane formed can be projected onto the irradiation surface; accordingly, a beam spot having a homogeneous energy distribution can be formed. In order to project the beam, a doublet cylindrical lens 414, which is a short-side direction projecting cylindrical lens, is disposed at 1,650 mm from the short-side direction condensing cylindrical lens 412 on the irradiation surface side. Here, the doublet cylindrical lens is a lens including two cylindrical lenses. The above-described doublet cylindrical lens 414 includes a cylindrical lens 414a and a cylindrical lens 414b. The cylindrical lens 414a has a thickness of 8 mm, a first plane with a radius of curvature of +125 mm, and a second plane with a radius of curvature of +47 mm. The cylindrical lens 414b has a thickness of 20 mm, a first plane with a radius of curvature of +52 mm, and a second plane with a radius of curvature of −200 mm. The distance between the two cylindrical lenses 414a and 414b is 5.5 mm. This makes it possible to homogenize the energy distribution of the beam spot of the laser beam in a short side direction and determine the length in a short side direction. The doublet cylindrical lens 414 is not necessarily used; however, a space can be secured by using the doublet cylindrical lens 414 because enough distance can be obtained between the optical system and the irradiation surface 415. The beam is projected onto the irradiation surface 415 disposed at 204 mm from the doublet cylindrical lens 414 on the irradiation surface side. Thus, a beam having a homogeneous energy distribution in a short side direction can be formed.

Next, a plane view of FIG. 8A is described. The laser beam emitted from the laser oscillator 401 passes through the transfer lens 402 and the deflecting mirror 403 and is injected into the deflecting mirror 405. The laser beam whose moving direction is deflected by the deflecting mirror 405 passes through a long-side direction transferring cylindrical lens 407. The long-side direction transferring cylindrical lens 407 serving as a transfer lens is disposed so that the deflecting mirror 405 and a long-side direction forming cylindrical lens array 411 are conjugated. The long-side direction transferring cylindrical lens 407 has a first plane with a radius of curvature of +150 mm, and is disposed at 600 mm from the deflecting mirror 405 on the irradiation surface side.

A long-side direction angle correcting cylindrical lens 410 is provided in the present optical system so as to correct a spread angle of a laser beam. The long-side direction angle correcting cylindrical lens 410 is disposed just before the long-side direction forming cylindrical lens array 411. A curvature of the long-side direction angle correcting cylindrical lens 410 is preferably set at the same level as that of the long-side direction transferring cylindrical lens 407, so as to collimate laser beams. In this embodiment mode, a radius of curvature of a first plane of the long-side direction angle correcting cylindrical lens 410 is set +150 mm.

Further, the beam spot is divided in a long side direction by the long-side direction forming cylindrical lens array 411. After that, the divided laser beams are synthesized into one on the irradiation surface 415 by using a long-side direction projecting cylindrical lens 413 which is disposed at 425 mm from the long-side direction forming cylindrical lens array 411 on the irradiation surface side and has a thickness of 20 mm and a first plane with a radius of curvature of +800 mm. Accordingly, an energy distribution of the laser beam spot in a long side direction is homogenized, and the length in a long side direction is determined.

According to this embodiment mode, a transfer lens is provided in a position which allows a beam emission opening of a laser oscillator and an incidence plane of a cylindrical lens array to be conjugated. By the transfer lens, a laser beam is projected onto the incidence plane of the cylindrical lens array from the emission opening of the laser oscillator. Accordingly, even when a displacement is generated in a fixed angle of a deflecting mirror of an optical system, a moving direction of the laser beam which has passed through the transfer lens is corrected. Therefore, a variation in an intensity distribution of a laser beam which acts on the cylindrical lens array can be suppressed. Accordingly, an optical axis displacement caused by the displacement of the deflecting mirror in the optical system can be suppressed, and a linear beam with a high homogeneity can be formed on an irradiation surface. Note that, for example, the irradiation surface 415 shown in FIGS. 8A and 8B is irradiated with the laser beam, while a stage over which an irradiation subject is placed is moved.

Embodiment 1

Hereinafter, the present invention is further described in detail using embodiments for manufacturing a TFT. However, the present invention is not limited to those embodiments and shall be specified by the description of the scope of claims.

In Embodiment 1, a process for manufacturing a thin film transistor (TFT) using a laser irradiation apparatus of the present invention will be described with reference to FIGS. 9A to 9E.

Figure 9A:
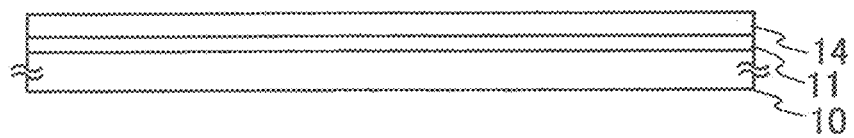
FIGS. 9A to 9E show a manufacturing process of a TFT.

In FIG. 9A, reference numeral 10 denotes a substrate having an insulating surface; 11, a base insulating film to become a blocking layer; and 14, a semiconductor film having a crystal structure by the irradiation with a laser beam.

In FIG. 9A, the substrate 10 may be a glass substrate, a quartz substrate, a ceramic substrate, or the like. Further, a silicon substrate, a metal substrate, or a stainless steel substrate each having an insulating film formed thereover may be used. Furthermore, a heat-resistant plastic substrate which can resist a process temperature of the present process may be used.

First, as shown in FIG. 9A, a base insulating film 11 including an insulating film such as a silicon oxide film, a silicon nitride film, or a silicon oxynitride film ($SiO_xN_y$) is formed over the substrate 10. As a typical example, the base insulating film 11 has a two-layer structure in which a silicon nitride oxide film with a thickness of 50 to 100 nm formed by using $SiH_4$, $NH_3$, and $N_2O$ as a reaction gas and a silicon oxynitride film with a thickness of 100 to 150 nm formed by using $SiH_4$ and $N_2O$ as a reaction gas are stacked. It is preferable to use a silicon nitride film (SiN film) or a silicon oxynitride film ($SiN_xO_y$ film, x≥y) with a thickness of 10 nm or less as a layer of the base insulating film 11. Moreover, a three-layer structure formed by sequentially stacking a silicon nitride oxide film, a silicon oxynitride film, and a silicon nitride film may also be used.

Next, a semiconductor film having an amorphous structure is formed over the base insulating film 11. The semiconductor film is formed with a semiconductor material containing silicon as its main component. Typically, an amorphous silicon film, an amorphous silicon germanium film, or the like is formed by a sputtering method, an LPCVD method, a plasma CVD method, or the like in a thickness of 25 to 80 nm (preferably 30 to 60 nm). In this embodiment, an amorphous silicon film is formed in 55 nm thick by a plasma CVD method. Next, a semiconductor film having a crystal structure 14 is obtained by carrying out a crystallization process. This crystallization process is carried out by using a laser crystallization method in accordance with the present invention. The laser crystallization method may be conducted in combination with another crystallization process (such as RTA, a thermal crystallization method using an anneal furnace or the like, or a thermal crystallization method using a catalyst such as nickel).

FIG. 9A is a process cross-sectional view in which a crystalline silicon film is formed by a laser crystallization method by applying a laser irradiation method of the present invention to a semiconductor film. By this step, a semiconductor film having a crystal structure 14 can be obtained. Further, in FIG. 9A, in order to increase the degree of crystallinity of a semiconductor film having a crystal structure obtained by another method than the laser crystallization method, a step of irradiating with a laser beam of the present invention may be conducted. In such a case, it is preferable to remove a naturally-formed oxide film on a surface, which is formed in the crystallization process, before the laser irradiation. As the laser irradiation method, a method shown in any of embodiment modes of the present invention is preferably employed.

As a laser oscillator used at the laser irradiation, a laser oscillator capable of emitting ultraviolet light, visible light, or infrared light can be used. As the laser oscillator, an excimer laser such as an KrF excimer laser, an ArF excimer laser, a XeCl excimer laser, or a Xe excimer laser; a gas laser such as a He laser, a He—Cd laser, an Ar laser, a He—Ne laser, or a HF laser; a solid-state laser using a crystal such as YAG, $GdVO_4$, $YVO_4$, YLF, $YAlO_3$ doped with Cr, Nd, Er, Ho, Ce, Co, Ti, or Tm; or a semiconductor laser such as a GaN laser, a GaAs laser, a GaAlAs laser, or a InGaAsP laser can be used. As the solid-state laser, it is preferable to use first to fifth harmonics of a fundamental wave.

Typically, an excimer laser beam having a wavelength of 400 nm or shorter, or a second or third harmonic of a YAG laser is used as the laser beam. For example, a pulsed laser beam having a repetition rate of approximately 10 Hz to 1 GHz is used.

In the case of using these lasers, a method is used in which a laser beam emitted from the laser oscillator is condensed so as to be linear by an optical system and is delivered to a semiconductor film. The condition of the crystallization is selected appropriately by a practitioner. However, when an excimer laser is used, the pulse repetition rate is set in a range of 30 to 300 Hz and the laser energy density is set in a range of 100 to 800 mJ/cm$^2$ (typically 200 to 700 mJ/cm$^2$). In the case of using a YAG laser, it is preferable that the second harmonic be used, the repetition rate be set in a range of 1 to 10,000 Hz, and the laser energy density be set in a range of 300 to 1,000 mJ/cm$^2$ (typically 350 to 800 mJ/cm$^2$). Then, the laser beam condensed to be linear so as to have a width of 100 to 1,000 μm, for example 400 Ξm, is delivered to an entire surface of the substrate.

Figure 9B:
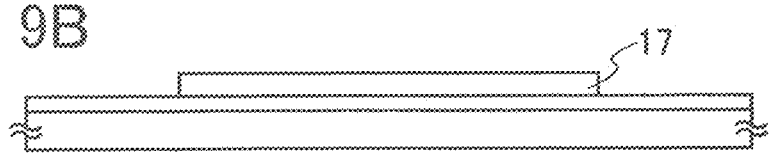

Next, a semiconductor layer 17 is formed by using a photolithography technique (FIG. 9B). Before forming a resist mask to be used at the photolithography, an oxide film is formed by generating ozone with the use of an ozone-containing aqueous solution or UV irradiation in an oxygen atmosphere, in order to protect the semiconductor layer 17. Here, the oxide film also has an advantageous effect to increase the wettability of the resist.

Before this step, a small amount of impurity elements (boron or phosphorus) is added through the oxide film in order to control a threshold value of a TFT if necessary. In the case of conducting the doping through the oxide film, the oxide film is removed and another oxide film is newly formed by using an ozone-containing aqueous solution.

Figure 9C:
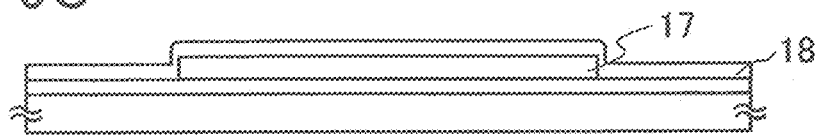
Figure 9D:
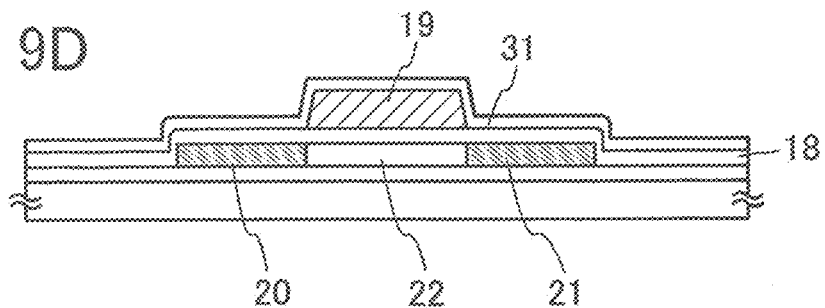

Next, an insulating film containing silicon as its main component is formed as a gate insulating film 18 so as to cover a surface of the semiconductor layer 17 (FIG. 9C). Here, in order to decrease the number of steps, the gate insulating film 18 is formed without removing the oxide film. The oxide film may be removed by an etchant containing fluorinated acid before forming the gate insulating film 18. The oxide film on the semiconductor layer 17 is not necessarily removed completely, and the oxide film may be remained thinly. If the etching is conducted excessively to expose the semiconductor layer 17, the surface of the semiconductor layer 17 may be contaminated with an impurity.

Next, after washing a surface of the gate insulating film 18, a gate electrode 19 is formed. Then, an impurity element imparting n-type conductivity (such as P or As) to a semiconductor is added appropriately to form a source region 20 and a drain region 21 and define a channel formation region 22. In this embodiment, phosphorus is added as an impurity element. Next, an interlayer insulating film 31 is formed. As the interlayer insulating film 31, an insulating film containing silicon is formed in a thickness of 100 to 200 nm by a plasma CVD method or a sputtering method. In this embodiment, a silicon oxynitride film is formed in 150 nm thick by a plasma CVD method. The interlayer insulating film 31 is not limited to the silicon oxynitride film and may have a single-layer structure or multilayer structure including another insulating film containing silicon. After that, heat treatment, irradiation with high-intensity light, or irradiation with a laser beam is conducted in order to activate the impurity element. At the same time as the activation, it is possible to recover plasma damage to the gate insulating film 18 or plasma damage to an interface between the gate insulating film 18 and the semiconductor layer 17. In particular, it is very effective to activate the impurity element by irradiating with the second harmonic of a YAG laser from a top side or a rear side of the substrate in an atmosphere at room temperature to 300° C. A YAG laser is a preferable activation means because the maintenance is not necessary so often. In the case of using a laser annealing method, the method shown in embodiment modes of the present invention is preferably employed.

Figure 9E:
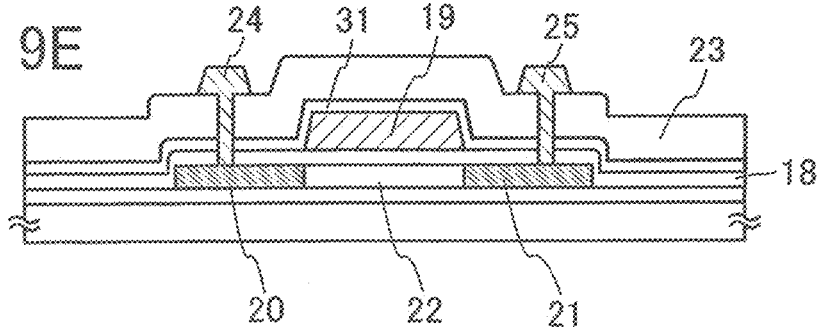

As the subsequent steps, an interlayer insulating film 23 is formed; hydrogenation is conducted; contact holes reaching a source region and a drain region are formed; a conductive film is formed; and a source electrode 24 and a drain electrode 25 are formed. Thus, a TFT (n-channel TFT) is completed (FIG. 9E). The source electrode 24 and the drain electrode 25 are formed with a single layer or multilayer including an element selected from Mo, Ta, W, Ti, Al, and Cu, or an alloy material or compound material containing the above element as its main component. For example, a three-layer structure including a Ti film, a pure-Al film, and another Ti film, or a three-layer structure including a Ti film, an Al alloy film containing Ni and C, and another Ti film is used. Moreover, in consideration of forming an interlayer insulating film and the like in later steps, the cross-sectional shape of the electrodes is preferably tapered.

The present invention is not limited to the TFT structure shown in FIG. 9E. The TH may have a low-concentration drain structure in which an LDD (Lightly Doped Drain) region is provided between the channel formation region and the drain region (or source region) if necessary. In this structure, a region in which an impurity element is added at low concentration is provided between the channel formation region and a source region or a drain region which is formed by adding the impurity element at high concentration, and this region is referred to as the LDD region. Moreover, another structure can also be employed in which the LDD region is disposed to overlap the gate electrode through the gate insulating film, namely a GOLD (Gate-drain Overlapped LDD) structure.

Although the n-channel TFT is described here, a p-channel TFT can also be formed by using an impurity element imparting p-type conductivity (such as boron) to a semiconductor instead of the impurity element imparting n-type conductivity to a semiconductor.

Here, although the top-gate TFT is described as an example, the present invention can be applied regardless of the TFT structure. For example, the present invention can be applied to a bottom-gate (inversely staggered) TFT or a staggered TFT.

By employing a laser annealing method using a laser irradiation apparatus of the present invention, it is possible to conduct a process without giving much thermal damage to a substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate.

Embodiment 2

Embodiment 2 will describe a manufacturing method of a light-emitting device (FIGS. 10A and 10B) having an EL element, which is also referred to as an organic EL display or an organic light-emitting diode.

An EL element having a layer containing an organic compound as a light-emitting layer has a structure in which the layer containing an organic compound (hereinafter referred to as an EL layer) is sandwiched between an anode and a cathode. By applying an electric field to the anode and the cathode, luminescence (Electro Luminescence) is generated from the EL layer. Light emitted from the EL element includes light emitted when returning from a singlet-excited state to a ground state (fluorescence) and light emitted when returning from a triplet-excited state to the ground state (phosphorescence).

First, a base insulating film 811 is formed over a substrate 810. In the case of taking out light by setting the substrate 810 side as a display plane, a glass substrate or quartz substrate having a light-transmitting property is preferably used as the substrate 810. Moreover, a light-transmitting plastic substrate which can resist process temperature may also be used. On the other hand, in the case of taking out light by setting a side opposite to the substrate 810 side as a display plane, a silicon substrate, a metal substrate, or a stainless steel substrate with an insulating film formed thereover may be used, as well as the above mentioned substrate. Here, a glass substrate is used as the substrate 810. The refractive index of the glass substrate is approximately 1.55.

A base insulating film including an insulating film such as a silicon oxide film, a silicon nitride film, or a silicon oxynitride film is formed as the base insulating film 811. Here, an example of forming the base film having a two-layer structure is shown; however, a single-layer structure or multilayer structure having more than two layers including the insulating film may also be used. It is to be noted that the base insulating film is not necessarily formed.

Next, a semiconductor layer is formed over the base insulating film 811. The semiconductor layer is formed with a semiconductor film having an amorphous structure by a sputtering method, an LPCVD method, a plasma CVD method, or the like. Then, a crystalline semiconductor film is obtained by a crystallization process. This crystallization process is conducted by using a laser crystallization method in accordance with the present invention. The laser crystallization may be conducted alone or may be conducted in combination with another crystallization process (such as RTA, a thermal crystallization method using a furnace anneal or the like, or a thermal crystallization method using a catalyst such as nickel). The material of the crystalline semiconductor film is not limited; however, silicon or silicon germanium (SiGe) alloy is preferably used. As a laser oscillator emitting a laser beam, a laser oscillator capable of emitting ultraviolet light, visible light, or infrared light can be used. Typically, an excimer laser beam having a wavelength of 400 nm or shorter, or a second or third harmonic of a YAG laser is used as the laser beam. For example, a pulsed laser beam having a repetition rate of approximately 10 Hz to 1 GHz is used.

A continuous wave laser may be used in the laser beam irradiation at the crystallization process of the semiconductor film having an amorphous structure or in the laser beam irradiation after the crystallization. In order to obtain a large grain crystal in the crystallization of the amorphous semiconductor film, it is preferable to use a continuous wave solid-state laser and apply second to fourth harmonics of the laser beam. Typically, a second harmonic (532 nm) or a third harmonic (355 nm) of a Nd:YVO$_4$ laser (fundamental wave 1,064 nm) may be used.

Next, an extremely thin oxide film with a thickness of approximately 2 nm is formed on a surface of the semiconductor layer by using ozone water. Then, a small amount of impurity elements (boron or phosphorus) is added to control a threshold voltage of a TFT. In this embodiment, an ion doping method is employed in which diborane ($B_2H_6$) is plasma-excited without mass-separating diborane. The doping condition is such that the acceleration voltage is 15 kV, the gas contains diborane diluted with hydrogen by 1%, the gas flow rate is 30 sccm, and the dose is $2\times10^{12}/cm^2$, so that boron is added into the amorphous silicon film.

Next, the extremely thin oxide film on the surface is removed. Then, a thin oxide film is formed again by using ozone water. Then, a mask made of resist is formed using a first photomask, and a semiconductor layer isolated in a desired island shape is formed by conducting an etching process. At this stage, the thickness of the semiconductor layer is set so as to be 25 to 80 nm (preferably 30 to 70 nm).

Next, the surface of the silicon film is washed at the same time as removing the oxide film with an etchant including fluorinated acid. Then, an insulating film containing silicon as its main component is formed as a gate insulating film 812. Here, a silicon oxynitride film (composition ratio Si:O:N: H=32:59:7:2) is formed in 115 nm thick by a plasma CVD method.

Then, a first conductive film having a thickness of 20 to 100 nm and a second conductive film having a thickness of 100 to 400 nm are stacked over the gate insulating film 812. In this embodiment, a tantalum nitride film of 50 nm thick and a tungsten film of 370 nm thick are stacked in order over the gate insulating film. As conductive materials for forming the first and second conductive films, an element selected from Ta, W, Ti, Mo, Al, and Cu or an alloy material or compound material containing the above-described element as its main component is used.

Next, a resist mask is formed using a second photomask, and etching is conducted by a dry etching method or a wet etching method. By this etching step, the first and second conductive films are etched, thereby obtaining conductive layers 814a, 814b, 815a, and 815b. In this embodiment, an ICP etching method is used and the films are etched once or multiple times into a desired tapered shape by appropriately adjusting the etching condition (such as the electric power applied to a coil-shaped electrode, the electric power applied to an electrode on the substrate side, and the electrode temperature on the substrate side). As an etching gas, a gas containing chlorine typified by $Cl_2$, $BCl_3$, $SiCl_4$, or $CCl_4$; a gas containing fluorine such as $CF_4$, $SF_6$, or $NF_3$; or $O_2$ can be appropriately used. An angle of the tapered portion of the conductive layer 814a is set at 15 to 45°, and that of the conductive layer 814b is set at 60 to 89°.

The conductive layers 814a and 814b become a gate electrode of a TFT, while the conductive layers 815a and 815b become a terminal electrode.

After removing the resist mask, a resist mask is newly formed using a third photomask. Then, in order to form an n-channel TFT which is not shown in the drawing here, a first doping step is conducted to dope the semiconductor with an impurity element imparting n-type conductivity (typically phosphorus or arsenic) at low concentration. The resist mask covers the region to become a p-channel TFT and a vicinity of the conductive layers. The first doping step is conducted through the gate insulating film 812, thereby forming a low-concentration impurity region. One light-emitting element is driven by using a plurality of TFTs; however, the doping step is not particularly necessary in the case of driving the light-emitting element only by using a p-channel TFT.

After removing the resist mask, a resist mask is newly formed using a fourth photomask. Then, a second doping step is conducted to dope the semiconductor with an impurity element imparting p-type conductivity (typically boron) at high concentration. The second doping step is conducted through the gate insulating film 812, so that p-type high-concentration impurity regions 817 and 818 are formed and a channel formation region 819 is defined.

Next, a resist mask is newly formed using a fifth photomask. In order to form an n-channel TFT which is not shown in the drawing here, a third doping step is conducted to dope the semiconductor with an impurity element imparting n-type conductivity (typically phosphorus or arsenic) at high concentration. The condition of an ion doping method in the third doping step is such that the dose is $1\times10^{13}$ to $5\times10^{15}/cm^2$ and the acceleration voltage is 60 to 100 keV. The resist mask covers the region to become a p-channel TFT and a vicinity of the conductive layers. The third doping step is conducted through the gate insulating film 812 to form an n-type high-concentration impurity region.

After removing the resist mask, an insulating film 813 containing hydrogen is formed. Then, activation of the impurity element added in the semiconductor layer and hydrogenation are conducted. The insulating film 813 containing hydrogen is formed with a silicon nitride oxide film (SiNO film) obtained by a PCVD method. The activation of the impurity element and the hydrogenation are conducted by heat treatment, high-intensity light irradiation, or laser beam irradiation. By this process, at the same time, it is possible to recover plasma damage to the gate insulating film 812 or plasma damage to an interface between the gate insulating film 812 and the semiconductor layer. In particular, it is very effective to activate the impurity element by irradiating with the second harmonic of a YAG laser from a top side or a rear side of the substrate in an atmosphere at room temperature to 300° C. A YAG laser is a preferable activation means because the maintenance is not necessary so often. In the case of employing a laser annealing method, a laser irradiation method of the present invention is preferably employed. The insulating film 813 containing hydrogen is a first layer of the interlayer insulating film, and contains silicon oxide.

Next, a high heat resistant planarizing film 816 is formed as a second layer of the interlayer insulating film. As the high heat resistant planarizing film 816, an insulating film whose skeletal structure includes a bond of silicon (Si) and oxygen (O) obtained by a coating method is used. In this embodiment, a spin coating apparatus is used, and a coating material solution using a liquid material in which siloxane polymer is dissolved in a solvent (propylene glycol monomethyl ether (molecular formula: $CH_3OCH_2CH(OH)CH_3$)) is dropped from a nozzle while spinning the substrate with gradually increasing the rotation number from 0 rpm to 1,000 rpm, so that the coating material solution is spread homogeneously by centrifugal force. In the spin coating apparatus, the substrate is stored horizontally in a coating cup, and the coating apparatus includes a mechanism for rotating the whole coating cup and a mechanism for pressure-controlling an atmosphere inside the coating cup. Then, an edge removing process is conducted by an edge remover equipped in the coating apparatus. Next, prebake is conducted at 110° C. for 170 seconds. Then, the substrate is taken out from the spin coating apparatus and cooled. After that, baking is conducted at 270° C. for one hour. Thus, the high heat resistant planarizing film 816 is formed in 0.8 μm thick.

According to the structure of siloxane, siloxane can be classified into, for example, silica glass, alkylsiloxane polymer, alkylsilsesquioxane polymer, silsesquioxane hydride polymer, alkylsilsesquioxane hydride polymer, and the like. As an example of siloxane polymer, PSB-K1 and PSB-K31, which are coating insulating film materials manufactured by Toray Industries, Inc., and ZRS-5PH, which is a coating insulating film material manufactured by Catalysts & Chemicals Industries Co., Ltd., can be given.

Next, in order to dehydrate the high heat resistant planarizing film 816, heat treatment is conducted at 250 to 410° C. for one hour. This heat treatment may serve as both the activation of the impurity element added in the semiconductor layer and the hydrogenation. Further, a silicon nitride oxide film (SiNO film: thickness of 100 to 200 nm) obtained by a PCVD method may be formed as a third interlayer insulating film over the high heat resistant planarizing film 816. In the case of forming the third interlayer insulating film, the third interlayer insulating film is preferably removed selectively by using a wiring 822 or first electrodes 823R and 823G to be formed later as a mask.

A contact hole is formed in the high heat resistant planarizing film 816 using a sixth mask. At the same time, the high heat resistant planarizing film 816 in the periphery is removed. Here, etching (wet etching or dry etching) is conducted so that the high heat resistant planarizing film 816 and the insulating film 813 have a selective ratio. The etching gas to be used is not limited; however, at least one of $CF_4$, $O_2$, He, and Ar is preferably used.

Then, etching is conducted by using the sixth mask, so that the exposed gate insulating film 812 and the insulating film 813 are selectively removed. The etching process is conducted to the gate insulating film 812 and the insulating film 813 by using $CHF_3$ and Ar as an etching gas. In order to perform etching so that a residue is not left on the semiconductor layer, the etching time is preferably increased by approximately 10 to 20%.

Next, the sixth mask is removed, and a conductive film (Ti/Al/Ti or Mo/Al/Mo) is formed. Then, etching is conducted by using a seventh mask, thereby forming the wiring 822.

Next, the first electrodes 823R and 823G, that is, an anode (or cathode) of an organic light-emitting element are formed by using an eighth mask. As a material of the first electrodes 823R and 823G, a film or multilayer film including an element selected from Ti, TiN, $TiSi_xN_y$, Ni, W, $WSi_x$, $WN_x$, $WSi_xN_y$, NbN, Cr, Pt, Zn, Sn, In, and Mo, or an alloy or compound material containing the element as its main component may be used with a total thickness of from 100 to 800 nm.

In the case of taking out light by setting the substrate 810 side as a display plane, the first electrode is formed with a transparent conductive film. For the transparent conductive film, indium oxide-tin oxide (hereinafter referred to as ITO) can be used. Alternatively, indium oxide-tin oxide formed by using a target of ITO containing 2 to 10 wt % of silicon oxide by a sputtering method (hereinafter referred to as ITSO) can be used. Since ITSO is not crystallized even by heat treatment, ITSO has high flatness and a process for removing a convex portion by washing or polishing is not particularly necessary. Therefore, ITSO is desirable as the material for the first electrodes 823R and 823G. Besides ITSO, a transparent conductive film such as a light-transmitting oxide conductive film which contains silicon oxide and in which zinc oxide (hereinafter referred to as ZnO) is mixed in indium oxide by 2 to 20% may be used. Alternatively, a transparent conductive film of ZnO containing Ga (also referred to as GZO) may be used.

Next, an insulator 829 (referred to as a bank, a partition wall, a barrier wall, or the like) is formed covering edge portions of the first electrodes 823R and 823G using a ninth mask. As the insulator 829, an organic resin film obtained by a coating method, or an SOG film (for example, a $SiO_x$ film containing an alkyl group) is formed with a thickness of 0.8 to 1 µm.

Next, a hole-injecting layer 824H, light-emitting layers 824R and 824G, and an electron-transporting layer 824E, which are layers containing an organic compound, are formed by an evaporation method or a coating method. In order to increase the reliability, it is preferable to perform degassing by conducting vacuum heating before forming the hole-injecting layer 824H. For example, before evaporating an organic compound material, heat treatment at 200 to 400° C. is desirably conducted in a low-pressure atmosphere or an inert atmosphere in order to remove a gas contained in the substrate. In this embodiment, since the interlayer insulating film is formed with a $SiO_x$ film having a high heat resistance, the film can resist heat treatment at high temperature.

In the case of forming a layer containing an organic compound by a coating method using spin coating, it is preferable to perform baking by vacuum heating after applying the organic compound. For example, after applying a poly(ethylene dioxythiophene)/poly(styrene sulfone acid) aqueous solution (PEDOT/PSS) serving as the hole-injecting layer 824H on an entire surface, baking by vacuum heating is conducted.

The hole-injecting layer 824H may be formed by an evaporation method. For example, an oxide such as molybdenum oxide ($MoO_x$: x=2 to 3) and α-NPD, or such an oxide and rubrene can be co-evaporated, thereby increasing the hole-injecting property.

Next, the light-emitting layers 824R and 824G and the electron-transporting layer 824E, which are the layers containing an organic compound, are formed by an evaporation method in a film-forming chamber which is evacuated so as to have a degree of vacuum at 0.665 Pa or less, preferably $0.133 \times 10^{-1}$ to $10^{-3}$ Pa. At the evaporation, the organic compound is vaporized in advance by resistance heating, and the vaporized organic compound scatters toward the substrate 810 by opening a shutter. The vaporized organic compound scatters upward and goes through an opening portion provided in a metal mask, and then is deposited onto the substrate 810.

In order to achieve a full color, the mask is aligned for each of the emission colors (R, G and B). It is to be noted that a full color display can also be achieved by forming an electroluminescent layer showing white light emission and separately providing a color filter, a color filter and a color conversion layer, or the like.

For example, $Alq_3$ doped with DCM is formed in 40 nm thick as the light-emitting layer 824R so as to form a red light emitting region 835. Moreover, $Alq_3$ doped with DMQD is formed in 40 nm thick as the light-emitting layer 824G so as to form a green light emitting region 836. Although not shown here, PPD (4,4'-bis(N-(9-phenanthryl)-N-phenylamino)biphenyl) doped with CBP (4,4'-bis(N-carbazolyl)-biphenyl) is formed in 30 nm thick as a blue light-emitting layer, and SAlq (bis(2-methyl-8-quinolinolato)(triphenylsilanolato)aluminum) is formed in 10 nm thick as a blocking layer. Next, $Alq_a$ is formed in 40 nm thick as the electron-transporting layer 824E.

Next, a second electrode 825, that is, a cathode (or an anode) of the organic light-emitting element is formed. As a material of the second electrode 825, an alloy such as MgAg, MgIn, AlLi, $CaF_2$, or calcium nitride or a film formed by co-evaporating aluminum and an element belonging to the first or second group in the periodic table may be used. In the case where the second electrode 825 has a light-transmitting property, a transparent conductive film may be formed.

Before forming the second electrode 825, a light-transmitting layer may be formed of $CaF_2$, $MgF_2$, or $BaF_2$ as a cathode buffer layer (in thickness of 1 to 5 nm).

Moreover, a protective layer (a thin film containing silicon nitride or carbon as its main component) for protecting the second electrode 825 may be formed.

Next, the light-emitting element is sealed by attaching a sealing substrate 833 with a sealant 828. The sealing substrate 833 and the substrate 810 are attached to each other so that the sealant 828 covers an edge portion (tapered portion) of the high heat resistant planarizing film 816. A region surrounded by the sealant 828 is filled with a transparent filling material 827. As the filling material 827, there is not any particular limitation as long as the material has a light-transmitting property, and typically an ultraviolet curable epoxy resin or a thermosetting epoxy resin is preferably used. A dry agent may be included in the filling material 827. Here, a high heat resistant UV epoxy resin (2500 Clear, manufactured by Electrolight) with a refractive index of 1.50, a viscosity of 500 cps, a shore D hardness of 90, a tensile intensity of 3,000 psi, a Tg point of 150° C., a volume resistance of $1 \times 10^{15}$ Ω·cm, and a withstand voltage of 450 V/mil, is used. By filling a space between the pair of substrates with the filling material 827, the transmissivity of the whole can be increased.

Further, after patterning the sealant 828 over the sealing substrate 833 under an inert gas atmosphere or low pressure by a droplet discharge method, the pair of substrates may be attached to each other by dropping the filling material 827 within the seal pattern using an ink jet apparatus or a dispenser apparatus under low pressure so that an air bubble does not enter. At the same time as the attachment, the sealant 828 may be cured under low pressure by conducting ultraviolet irradiation or heat treatment. In addition to the ultraviolet irradiation, heat treatment may be conducted.

A dry inert gas may fill the region surrounded by the sealant 828. In the case of filling the region with a gas, it is preferable that a part of the sealing substrate 833 be ground to form a concave portion and then a dry agent be disposed in the concave portion.

Figure 10A:
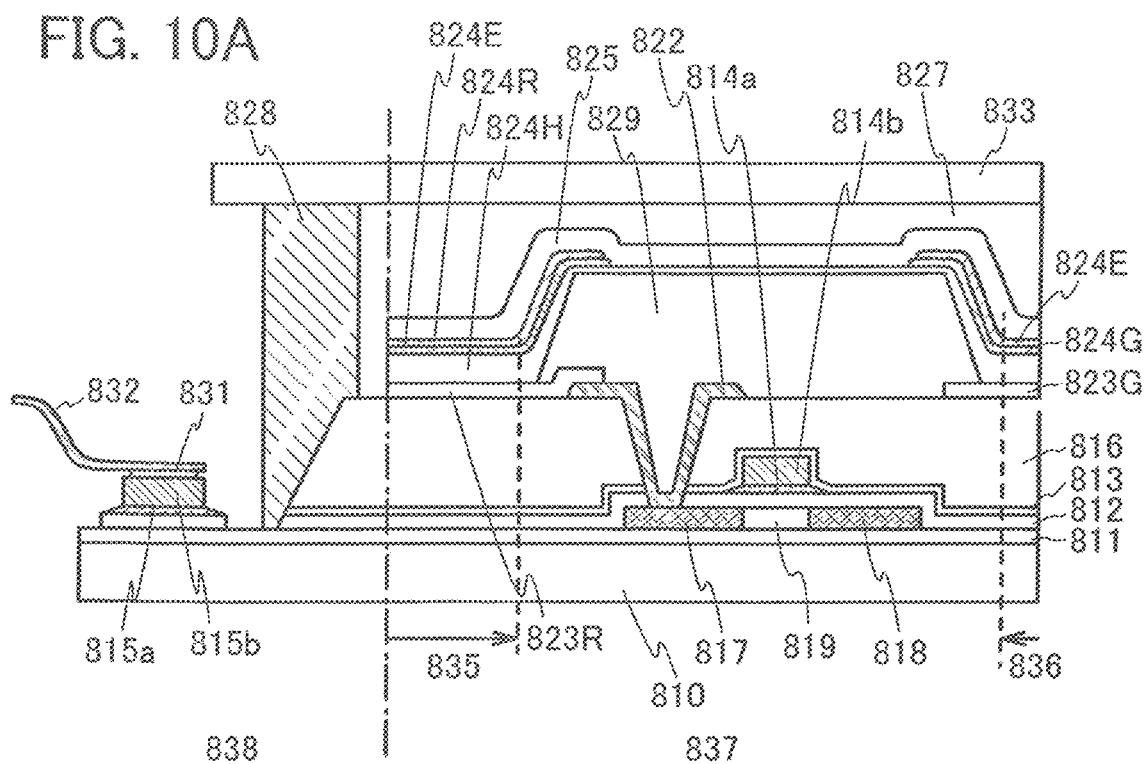
FIGS. 10A and 10B show a structure of an active matrix EL display device.

Finally, an FPC (flexible printed circuit) 832 is attached to the conductive layers 815*a* and 815*b* used as a terminal electrode with the use of an anisotropic conductive film 831. The conductive layers 815*a* and 815*b* are formed at the same time as the gate wiring (FIG. 10A). When the first electrodes 823R and 823G are formed, a transparent conductive film may be formed over the conductive layers 815*a* and 815*b*.

Figure 10B:
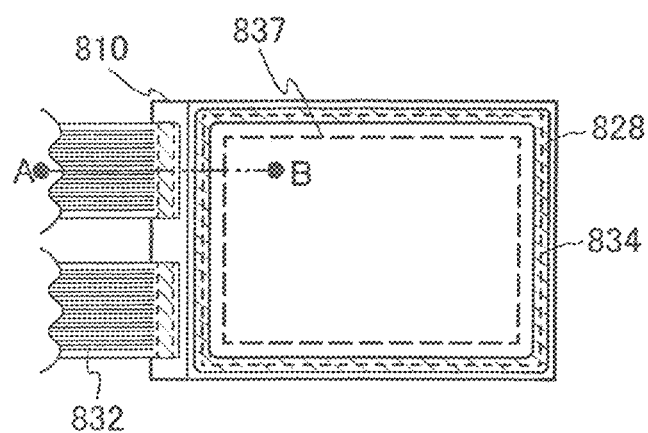

A top view is shown in FIG. 10B. As shown in FIG. 10B, an edge portion 834 of the high heat resistant planarizing film is covered with the sealant 828. A cross-sectional view taken along a chain line A-B in FIG. 10B corresponds to FIG. 10A.

An active matrix light-emitting device manufactured in this way has the high heat resistant planarizing film 816 as an interlayer insulating film of a TFT, typically formed of a material whose skeletal structure includes a bond of silicon (Si) and oxygen (O), and also includes silicon oxide in the first electrodes 823G and 823R. The reliability of the active matrix light-emitting device is increased by using a relatively stable material containing silicon oxide as the composition material of the light-emitting device.

When the first electrodes 823G and 823R are formed of a transparent material and the second electrode 825 is formed of a metal material, a structure in which light is taken out through the substrate 810, that is, a bottom emission structure is obtained. Further, when the first electrodes 823G and 823R are formed of a metal material and the second electrode 825 is formed of a transparent material, a structure in which light is taken out through the sealing substrate 833, that is, a top emission structure is obtained. If both of the first electrodes 823G and 823R and the second electrode 825 are formed of a transparent material, light can be taken out from both of the substrate 810 and the sealing substrate 833. The present invention may employ any one of the structures appropriately.

In the light-emitting device of the present invention, a driving method of screen display is not particularly limited. For example, a dot sequential driving method, a line sequential driving method, a plane sequential driving method, or the like may be used. Typically, the line sequential driving method is used, and a time division gradation driving method or an area gradation driving method may be used as appropriate. Further, a video signal to be input into a source line of the light-emitting device may be either an analog signal or a digital signal. A driver circuit and the like may be designed appropriately in accordance with the video signal.

In a light-emitting device in which a video signal is digital, the video signal to be input into a pixel may use constant voltage (CV) or constant current (CC). When the video signal uses the constant voltage (CV), the voltage applied to the light-emitting element is constant (CVCV) or the current flowing through the light-emitting element is constant (CVCC). On the other hand, when the video signal uses the constant current (CC), the voltage applied to the light-emitting element is constant (CCCV) or the current flowing in the light-emitting element is constant (CCCC).

In the light-emitting device according to this embodiment, a protective circuit (such as a protective diode) may be provided in order to avoid electrostatic damage.

There is no limitation on a TFT structure of the light-emitting device according to this embodiment. For example, a top-gate TFT, a bottom-gate (inversely staggered) TFT, or a staggered TFT can be used. Not only a TFT of a single-gate structure but also a multi-gate TFT having a plurality of channel formation regions, for example a double-gate TFT, may be used.

In order to enhance contrast of the pixel portion, a polarizing plate or a circular polarizing plate may be provided. For example, a polarizing plate or a circular polarizing plate can be provided on one surface or both surfaces of the display plane.

By employing a laser annealing method using a laser irradiation apparatus of the present invention, it is possible to conduct a process without giving much thermal damage to a substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate.

Embodiment 3

Figure 11:
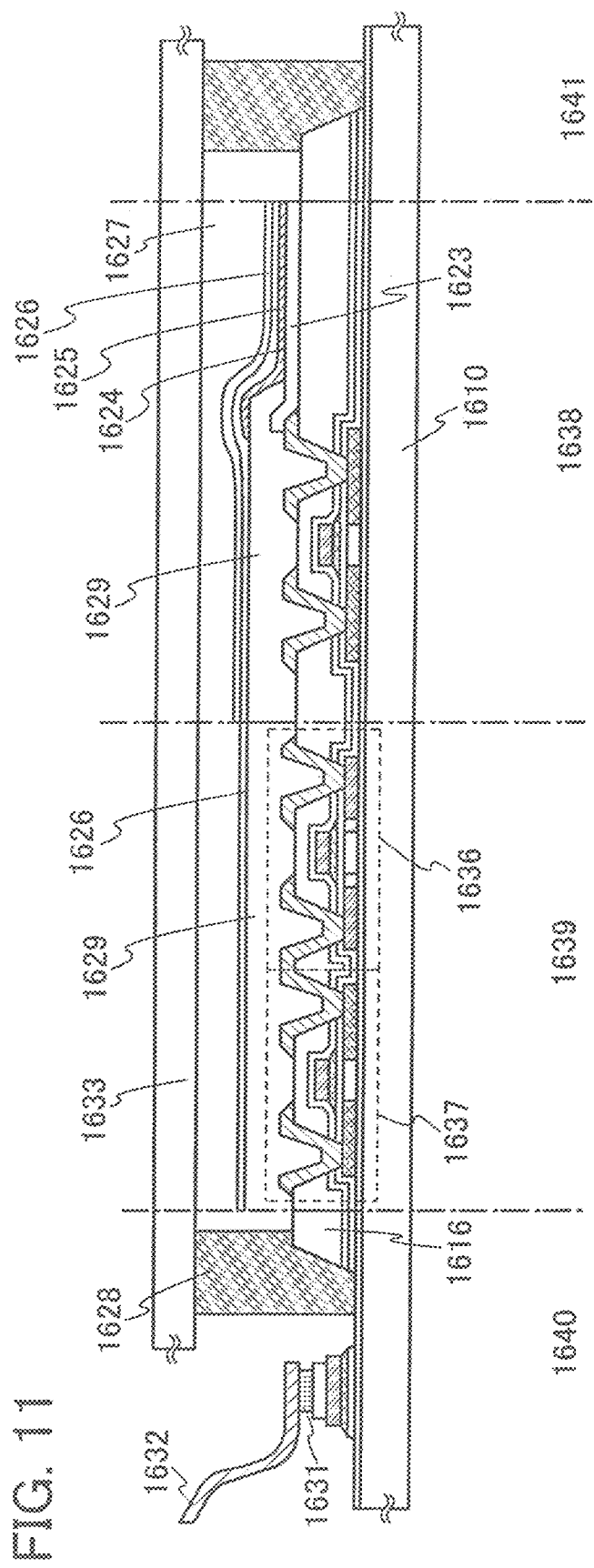
FIG. 11 shows a cross section of an EL display device.

Embodiment 2 shows only a pixel portion 837 and a terminal portion 838 in the drawings. Meanwhile, Embodiment 3 will describe an example of forming a pixel portion, a driver circuit, and a terminal portion over one substrate with reference to FIG. 11.

After forming a base insulating film over a substrate 1610, each semiconductor layer is formed. Then, after forming a gate insulating film covering the semiconductor layers, each gate electrode and terminal electrode are formed. Then, in order to form an n-channel TFT 1636, doping is conducted with an impurity element imparting n-type conductivity to a semiconductor (typically phosphorus or arsenic). In order to form a p-channel TFT 1637, doping is conducted with an impurity element imparting p-type conductivity to a semiconductor (typically boron). Thus, a source region and a drain region, and if necessary, an LDD region are appropriately formed.

Next, a SiNO film containing hydrogen and a high heat resistant planarizing film 1616 are formed as interlayer insulating films. As the high heat resistant planarizing film 1616, an insulating film whose skeletal structure includes a bond of silicon (Si) and oxygen (O) obtained by a coating method is used.

Next, a contact hole is formed in the SiNO film containing hydrogen and the high heat resistant planarizing film 1616 by using a mask. At the same time, the high heat resistant planarizing film 1616 in the periphery 1641 is removed. The SiNO film and the high heat resistant planarizing film 1616 may be tapered by conducting etching once or multiple times.

Next, etching is conducted by using the high heat resistant planarizing film 1616 as a mask to selectively remove the exposed SiNO film containing hydrogen or the exposed gate insulating film.

After forming a conductive film, etching is conducted using a mask, thereby forming a drain wiring and a source wiring. Next, a first electrode 1623 formed with a transparent conductive film, that is, an anode (or cathode) of an organic light-emitting element is formed. At the same time, a transparent conductive film is also formed over the terminal electrode.

In the following steps, an insulator 1629, a layer containing an organic compound 1624, a second electrode 1625 including a conductive film, and a transparent protective layer 1626 are formed and then the light-emitting element is sealed by attaching a sealing substrate 1633 using a sealant 1628 in a similar way to Embodiment 2. A region surrounded by the sealant 1628 is filled with a transparent filling material 1627. Finally, an FPC 1632 is attached to the terminal electrode with the use of an anisotropic conductive film 1631. The terminal electrode is preferably formed with a transparent conductive film and is formed at the same time as the gate wiring.

By the above steps, a pixel portion 1638, a driver circuit 1639, and a terminal portion 1640 are formed over one substrate. As shown in this embodiment, since an n-channel TFT and a p-channel TFT can be manufactured over one substrate, the driver circuit and the protective circuit can be manufactured over one substrate; thereby decreasing the number of mount items of an IC chip for driving.

The light-emitting device of this embodiment is not limited to the mode of manufacturing the n-channel TFT and the p-channel TFT over one substrate. For example, the pixel portion and the driver circuit may be formed with only an n-channel TFT or only a p-channel TFT to decrease the number of steps.

By employing a laser annealing method using a laser irradiation apparatus of the present invention, it is possible to conduct a process without giving much thermal damage to a semiconductor substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate.

Embodiment 4

Figure 12:
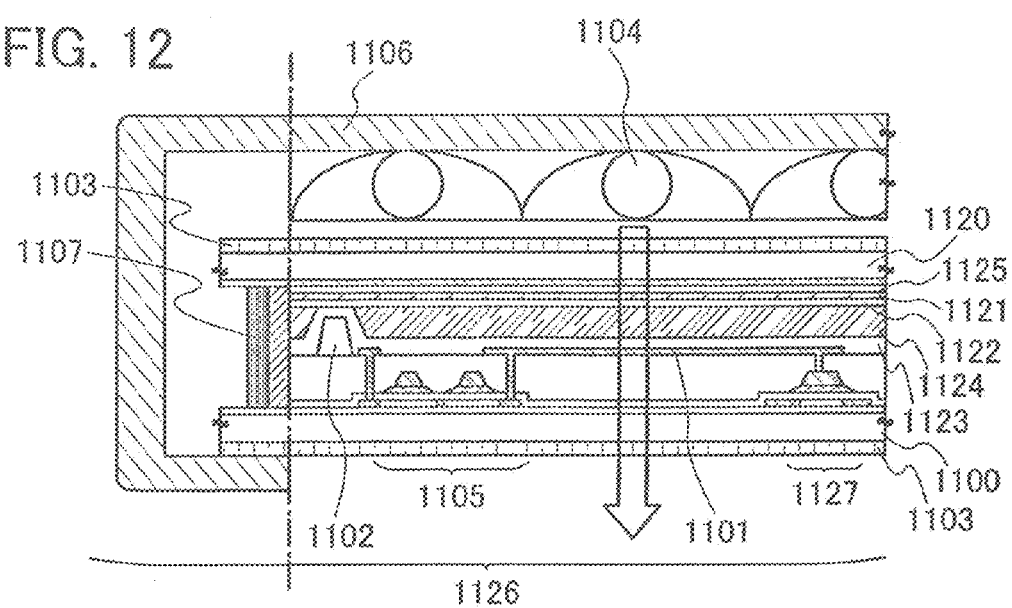
FIG. 12 shows a cross section of an active matrix liquid crystal display device.

Embodiment 4 will describe an example of manufacturing an active matrix liquid crystal display device (FIG. 12).

First, in accordance with Embodiment 1, a semiconductor layer, a TFT 1105 having the semiconductor layer as its active layer, and the like are formed over a substrate 1100, and a pixel portion 1126 is formed. The pixel portion 1126 includes a pixel electrode 1101 arranged in matrix, a switching element connected to the pixel electrode 1101, here a top gate TFT 1105, and a storage capacitor 1127. The storage capacitor 1127 uses an insulating film sandwiched between an electrode connected to the pixel electrode 1101 and the semiconductor layer, as a dielectric. By the present invention, a flat semiconductor layer can be obtained since the semiconductor layer is annealed homogeneously. Therefore, an insulating film having a homogeneous film thickness is obtained, and a variation of the storage capacitor 1127 is decreased.

This embodiment shows an example of a double gate TFT having a plurality of channel formation regions in order to decrease an off-current.

After forming the pixel portion 1126, formation of an orientation film 1123, a rubbing process, dispersal of a spherical spacer, formation of a pillar spacer, formation of a color filter, and the like are conducted.

Next, a sealant 1107 is patterned over an opposing substrate under an inert gas atmosphere or low pressure by a droplet discharge method. Here, the sealant 1107 is formed at a predetermined position (a closed pattern surrounding the pixel portion) with a dispenser apparatus or an ink jet apparatus. As a semi-transparent sealant 1107, a material containing a filler (diameter of 6 to 24 μm) and having a viscosity of 40 to 400 Pa·s is used. It is to be noted that the sealant which does not dissolve in a liquid crystal to be in contact later is preferably selected. As the sealant, an acrylic photocurable resin or an acrylic thermosetting resin is preferably used. Since the sealant 1107 has an easy seal pattern, the sealant 1107 can also be formed by a printing method. Then, the sealant 1107 is temporally cured.

Then, a liquid crystal is dropped in a region surrounded by the sealant 1107 with an ink jet apparatus or a dispenser apparatus. As the liquid crystal, a liquid crystal material having a viscosity that can be discharged with an ink jet apparatus or a dispenser apparatus may be used. Since the viscosity of the liquid crystal material can be set by adjusting the temperature, the liquid crystal material is appropriate for a droplet discharge method. By a droplet discharge method, only a necessary amount of liquid crystals can be held in the region surrounded by the sealant 1107.

After dropping the liquid crystal, the pair of substrates is attached to each other under low pressure so that an air bubble does not enter. Here, at the same time as the attachment, ultraviolet irradiation or heat treatment is conducted to cure the sealant 1107 under low pressure. In addition to the ultraviolet irradiation, heat treatment may be conducted.

The substrate is divided into a panel size appropriately. Then, an FPC, an IC, an optical film, or the like is attached appropriately, thereby manufacturing a liquid crystal module. Next, a backlight bulb 1104 and a mirror are provided to the obtained liquid crystal module, and the module is covered with a cover 1106. Thus, an active matrix liquid crystal display device (transmissive type) whose cross sectional shape is partially shown in FIG. 12 is completed. Alternatively, the backlight may be disposed outside the display region and a light guide plate may be used. The cover and the liquid crystal module are fixed by using an adhesive or an organic resin. Since the device is a transmissive type, a polarizing plate 1103 is attached to both of the active matrix substrate and the opposing substrate. Further, another optical film (such as an anti-reflection film or a polarizing film) or a protective film (not shown) may be provided.

In FIG. 12, reference numeral 1100 denotes a substrate; 1101, a pixel electrode; 1102, a pillar spacer; 1107, a sealant;

1120, a colored layer serving as a color filter; 1125, a planarizing film; 1121, an opposing electrode; 1122 and 1123, orientation films; and 1124, a liquid crystal layer.

The liquid crystal display device of this embodiment is not limited to the mode of manufacturing the n-channel TFT and the p-channel TFT over one substrate. The pixel portion 1126 and the driver circuit may be formed with only an n-channel TFT or only a p-channel TFT to decrease the number of steps.

By employing a laser annealing method using a laser irradiation apparatus of the present invention, it is possible to conduct a process without giving much thermal damage to a semiconductor substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate. Accordingly, a liquid crystal display device, which employs the laser annealing method using the laser irradiation apparatus of the present invention, can have an advantage that an operation property and reliability are improved.

Embodiment 5

Figure 13A:
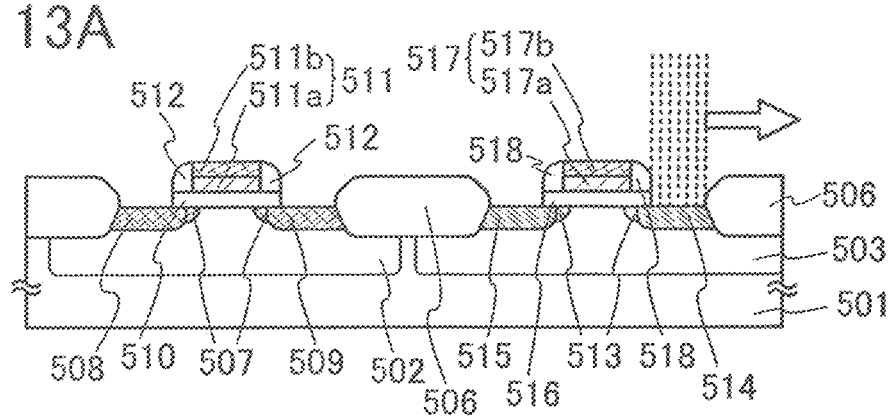
FIGS. 13A and 13B show a manufacturing process of a FET.

A manufacturing procedure of a field effect transistor (hereinafter referred to as a FET) using the present invention is briefly described below, with reference to FIGS. 13A and 13B.

First, a single crystal silicon substrate 501 is prepared. In a first element forming region on a main surface of the single crystal silicon substrate 501 (over an element forming surface or a circuit forming surface) and a second element forming region thereof, an n-type well 502 and a p-type well 503 are selectively formed respectively.

Then, a field oxide film 506 to serve as an element isolation region for separating the first element forming region from the second element forming region is formed. The field oxide film 506 is a thick thermal oxide film, and may be formed by a LOCOS method. Note that the element isolation method is not limited to the LOCOS method, and for example, the element isolation region may have a trench structure by using a trench isolation method or may have a combination of the LOCOS structure and the trench structure.

Then, a gate insulating film is formed by, for example, thermally oxidizing the surface of the silicon substrate 501. The gate insulating film may be formed by a CVD method and can be formed by using a silicon oxynitride film, a silicon oxide film, a silicon nitride film, or a stacked film thereof. For example, a stacked film is formed by stacking a silicon oxide film with a thickness of 5 nm obtained by thermal oxidation and a silicon oxynitride film with a thickness of 10 to 15 nm obtained by a CVD method.

Then, stacked films of polysilicon layers 511a and 517a and silicide layers 511b and 517ba are formed over the entire surface, and formed into a predetermined pattern by a lithography technique and a dry etching technique; thereby forming gate electrodes 511 and 517 having a polycide structure over the gate insulating film. The polysilicon layers 511a and 517a may be doped with phosphorus (P) in advance at a concentration of about $10^{21}/cm^3$ in order to lower the resistance, or an impurity imparting n-type conductivity may be diffused with high concentration after forming the polysilicon films. The silicide layers 511b and 517b may be formed by using molybdenum silicide ($MoSi_x$), tungsten silicide ($WSi_x$), tantalum silicide ($TaSi_x$), titanium silicide ($TiSi_x$), or the like.

Next, ion implantation is conducted shallowly to the silicon substrate 501 through the gate insulating film with low concentration, using an impurity imparting n-type conductivity and an impurity imparting p-type conductivity so as to form a p⁻region 507 and an n⁻region 513 respectively. By forming these p⁻region 507 and n⁻region 513, the concentration of the impurity has gradient at an end portion of the gate electrode; thereby increasing the reliability of an FET.

Since this embodiment describes the case of manufacturing a CMOS circuit, the first element faulting region for forming a p-channel FET is covered with a resist material, and arsenic (As) or phosphorus (P) as an impurity imparting n-type conductivity is injected into the silicon substrate. In addition, the second element forming region for forming an n-channel FET is covered with a resist material, and boron (B) as an impurity imparting p-type conductivity is injected into the silicon substrate.

Next, in order to activate the ion-implanted impurity and to recover a crystal defect in the silicon substrate caused by the ion implantation, a first activation process is conducted. In this embodiment, the laser annealing method described in embodiment modes of the present invention is employed in the first activation process. At this time, the semiconductor substrate is heated instantaneously up to the temperature as high as a melting point of Si, so that a thin layer on the surface is locally heated for the activation. By this process, the implanted impurity can be activated sufficiently. Moreover, the travel distance of the impurity by this process is as short as approximately 1 nm or less, thereby the diffusion of the impurity can be suppressed as much as possible.

Then, sidewalls 512 and 518 are formed on side walls of the gate electrodes. For example, the sidewalls 512 and 518 may be formed by stacking an insulating material layer made of silicon oxide over the entire surface by a CVD method, and then performing etch back to the insulating material layer. In performing the etch back, the gate insulating film may be selectively removed in a self-aligning manner. In addition, etching of the gate insulating film may be performed after the etch back. In this manner, a gate insulating film 510 is formed, which has an equal width to a total width of the gate electrode 511 and the sidewalls provided on the side walls of the gate electrode 511. In addition, a gate insulating film 516 is formed, which has an equal width to a total width of the gate electrode 517 and the sidewalls provided on the side walls of the gate electrode 517.

Then, ion implantation is performed to the exposed silicon substrate 501 in order to form source regions and drain regions. Since this embodiment describes the case of manufacturing a CMOS circuit, the first element forming region for forming a p-channel FET is covered with a resist material, and arsenic (As) or phosphorus (P) as an impurity imparting n-type conductivity is injected into the silicon substrate; thereby forming a source region 514 and a drain region 515. In addition, the second element forming region for forming an n-channel FET is covered with a resist material, and boron (B) as an impurity imparting p-type conductivity is injected into the silicon substrate 501; thereby forming a source region 508 and a drain region 509.

Then, a second activation process is performed in order to activate the ion-implanted impurity and to recover a crystal defect in the silicon substrate 501 caused by the ion implantation. The laser annealing method described in embodiment modes of the present invention is employed in the second activation process. A cross sectional view at this stage corresponds to FIG. 13A.

After the activation, an interlayer insulating film, a plug electrode, a metal wiring, and the like are formed. A first interlayer insulating film 531 is formed with a thickness of 100 to 2,000 nm by a plasma CVD method or a low pressure CVD method by using a silicon oxide film, a silicon oxynitride film, or the like. Then, a second interlayer insulating film 532 is formed thereover by using phosphorus silicate glass (PSG), boron silicate glass (BSG), or phosphorus boron silicate glass (PBSG). The second interlayer insulating film 532 is formed by a spin coating method or a normal pressure CVD method in order to increase the flatness.

Source electrodes 533 and 535 and drain electrodes 534 and 536 are formed after forming contact holes in the first interlayer insulating film 531 and the second interlayer insulating film 532 to reach the source regions and the drain regions of the each FET, and preferably formed by using aluminum (Al) that is often used as a low-resistance material in general. Alternatively, a stacked structure of Al and titanium (Ti) may be used.

In addition, although not shown in the drawing here, a contact hole is provided in the first interlayer insulating film 531 and the second interlayer insulating film 532 to reach the gate electrode, so that an electrode is formed to be electrically connected to a wiring provided over the first interlayer insulating film 531.

Figure 13B:
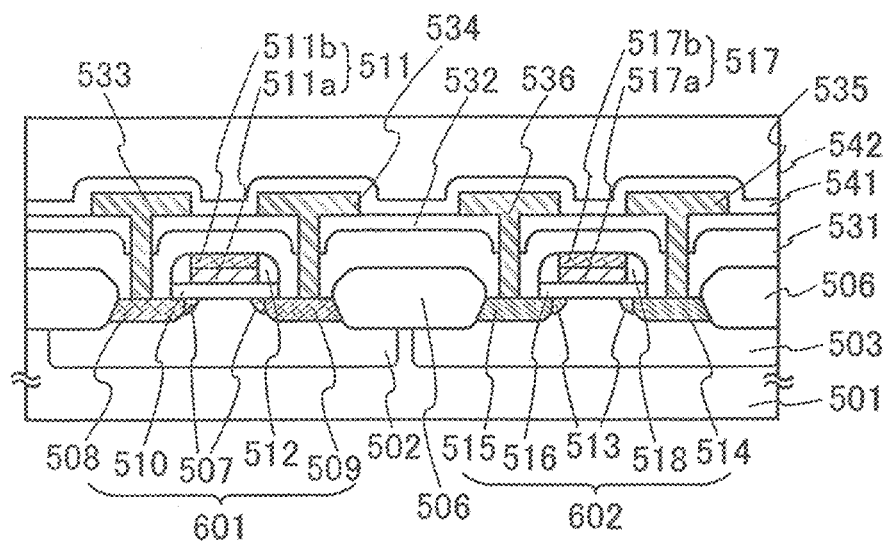

Finally, a passivation film 541 and a third interlayer insulating film 542 are formed, which is the state shown by FIG. 13B. In FIG. 13B, the left side corresponds to a p-channel TFT 601 while the right side corresponds to an n-channel TFT 602.

The passivation film 541 is formed by a plasma CVD method by using a silicon nitride film, a silicon oxide film, or a silicon nitride oxide film. Further, the third interlayer insulating film 542 is formed with a thickness of 1 to 2 μm by using an organic resin material. As the organic resin material, polyimide, polyamide, acrylic, benzocyclobutene (BCB), or the like can be used. What is advantageous in using an organic resin film is that the organic resin film is easily formed, parasitic capacitance can be lowered since a relative dielectric constant is low, and it is suitable for planarization. Needless to say, an organic resin film other than the aforementioned organic resin films can be used.

By employing a laser annealing method using a laser irradiation apparatus of the present invention, it is possible to conduct a process without giving much thermal damage to a semiconductor substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate.

Embodiment 6

Various electronic devices can be completed by mounting an integrated circuit in which TFTs manufactured by using a laser annealing method in accordance with the present invention are integrated. Moreover, when a TFT manufactured by a laser annealing method in accordance with the present invention is used as a switching element and a pixel electrode to be connected to the switching element is provided, a display portion of an electronic device as an active matrix substrate can be manufactured. Accordingly, various electronic devices can be completed.

As such electronic devices, a personal computer, a game machine, a portable information terminal (such as a mobile computer, a mobile phone, a mobile game machine, or an electronic book), a camera (such as a video camera and a digital camera), a projector, a navigation system, a sound reproducing device (such as a car audio or an audio component), an image reproducing device equipped with a recording medium (specifically, a digital versatile disc (DVD)), and the like can be given.

Figure 14:
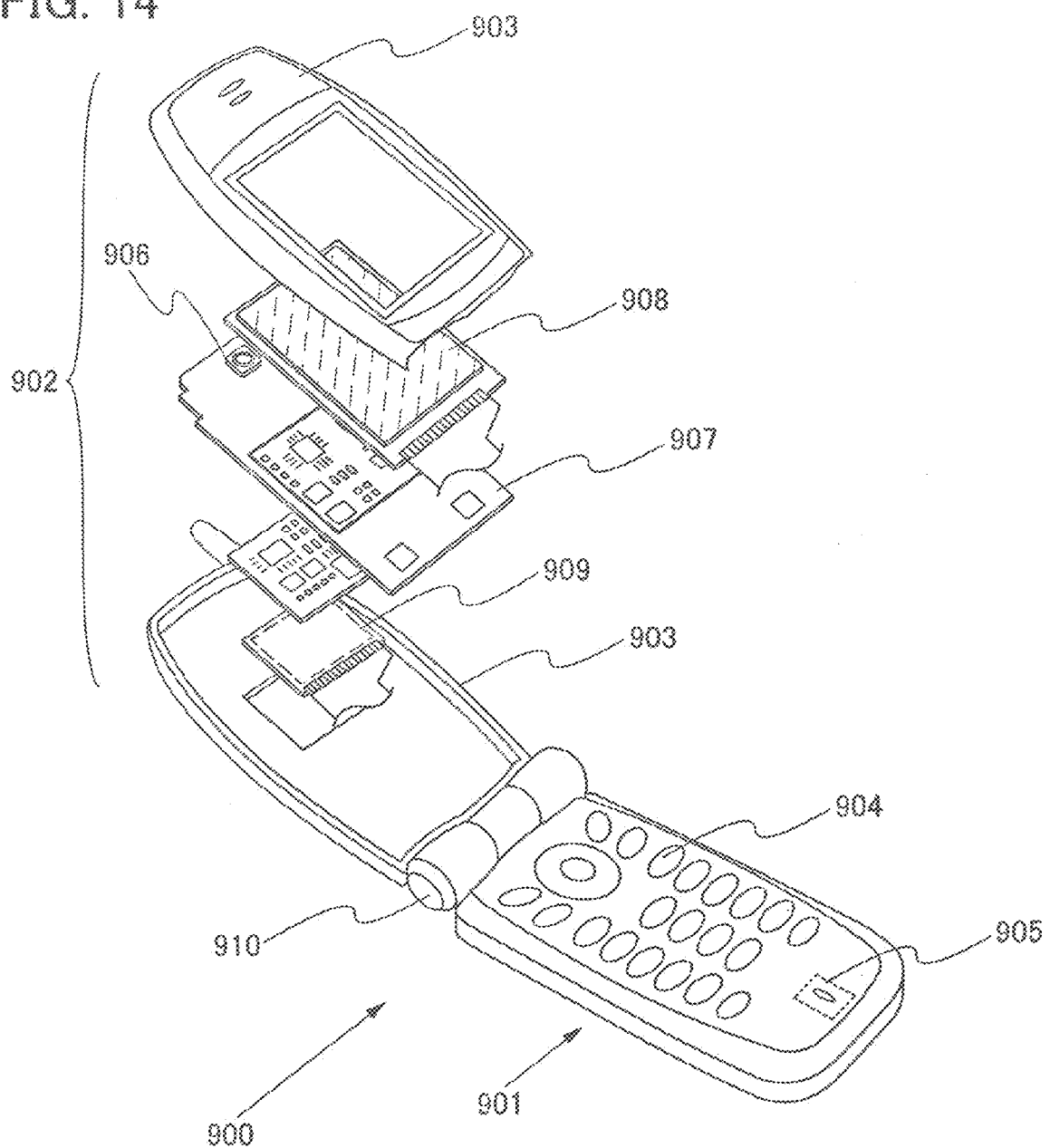
FIG. 14 shows an example of an electronic device.

A mobile phone as one electronic device of this embodiment is described as an example with reference to FIG. 14. This embodiment will show an example in which a mobile phone 900 is completed with an active matrix liquid crystal display device or a light-emitting device having an EL element described in Embodiments 2 to 4.

A mobile phone shown in FIG. 14 has a main body (A) 901 equipped with operation switches 904, a microphone 905, and the like and also has a main body (B) 902 equipped with a display panel (A) 908, a display panel (B) 909, a speaker 906, and the like. The main body (A) 901 and the main body (B) 902 are connected to each other with a hinge 910 so as to open and close. The display panel (A) 908 and the display panel (B) 909 are housed in a chassis 903 of the main body (B) 902 together with a circuit substrate 907. Pixel portions of the display panel (A) 908 and the display panel (B) 909 are arranged so as to be observed from an opening window formed in the chassis 903.

In the display panel (A) 908 and the display panel (B) 909, their specifications such as the number of pixels can be set appropriately in accordance with the function of the mobile phone 900. For example, the display panel (A) 908 and the display panel (B) 909 can be combined by setting the display panel (A) 908 as a main screen and the display panel (B) 909 as a sub screen.

By employing a laser annealing method using a laser irradiation apparatus of the present invention for forming the display panel (A) 908 and the display panel (B) 909, it is possible to drastically shorten the process time as compared with another annealing method using radiant heat or conductive heat. In addition, it is possible to conduct a process without giving much thermal damage to a semiconductor substrate, because the substrate is selectively heated. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate. Accordingly, the electronic device provided with the display panel (A) 908 and the display panel (B) 909 can have an advantage that an operation property and reliability are improved.

By using such a display panel, the display panel (A) 908 can serve as a color display screen with high definition which displays an emoticon or an image, while the display panel (B) 909 can serve as an information display screen of a single color which displays textual information. In particular, when higher definition is achieved by having an active matrix type of the display panel (B) 909, various pieces of textual information can be displayed so that the density of displaying information per screen can be increased. For example, when the display panel (A) 908 is QVGA (320 dots×240 dots) with a size of 2 to 2.5 inches, 64 gray scales, and 260,000 colors and the display panel (B) 909 is a high-definition panel with a single color, 2 to 8 gray scales, and 180 to 220 ppi, Chinese characters, Arabic letters, and the like can be displayed as well as Roman letters, hiragana, and katakana.

The mobile phone of this embodiment can be modified into various forms in accordance with its function or an intended purpose. For example, an imaging element may be incorporated in a portion of the hinge 910 and be treated as a camera-equipped mobile phone. Moreover, the above operation effect can be obtained even when the operation switches 904, the display panel (A) 908, and the display panel (B) 909 are housed in one chassis. Furthermore, a similar effect can be obtained even when the structure of this embodiment is applied to an information display terminal equipped with a plurality of display portions.

Embodiment 7

Various electronic devices can be completed by using TFTs manufactured by a laser annealing method in accordance with the present invention. Specific examples of the electronic devices are described with reference to FIGS. 15 to 17.

Figure 15:
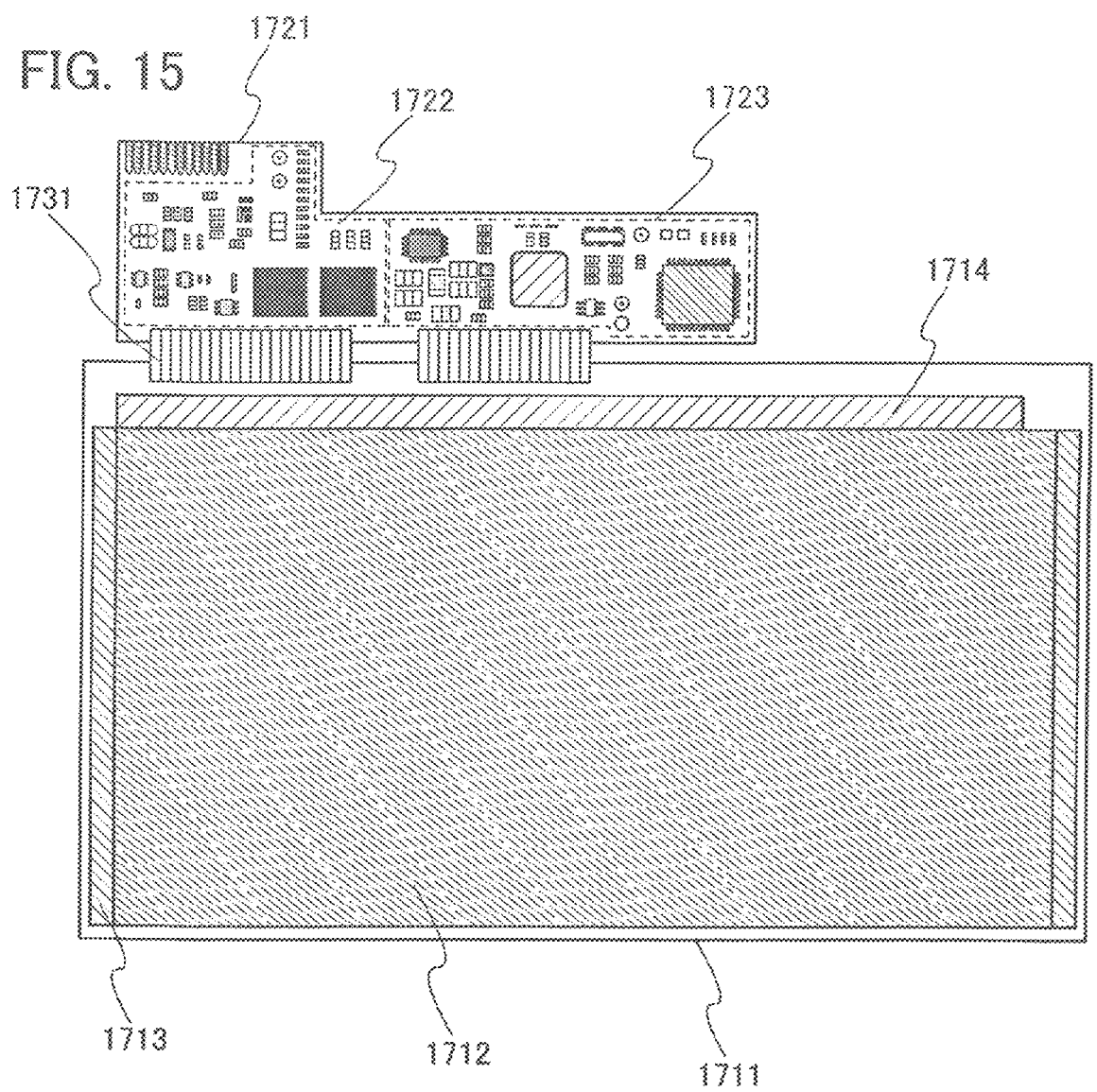
FIG. 15 shows an example of an electronic device.

FIG. 15 shows a liquid crystal module or an EL module in which a display panel 1711 and a circuit substrate 1721 are combined and connected with a connection wiring 1731. Over the circuit substrate 1721, for example, a control circuit 1722, a signal division circuit 1723, and the like are formed.

This display panel 1711 includes a pixel portion 1712, a scanning line driver circuit 1713, and a signal line driver circuit 1714 for supplying a video signal to the selected pixel. This structure is similar to that shown in Embodiment 2, 3, or 4.

Figure 16:
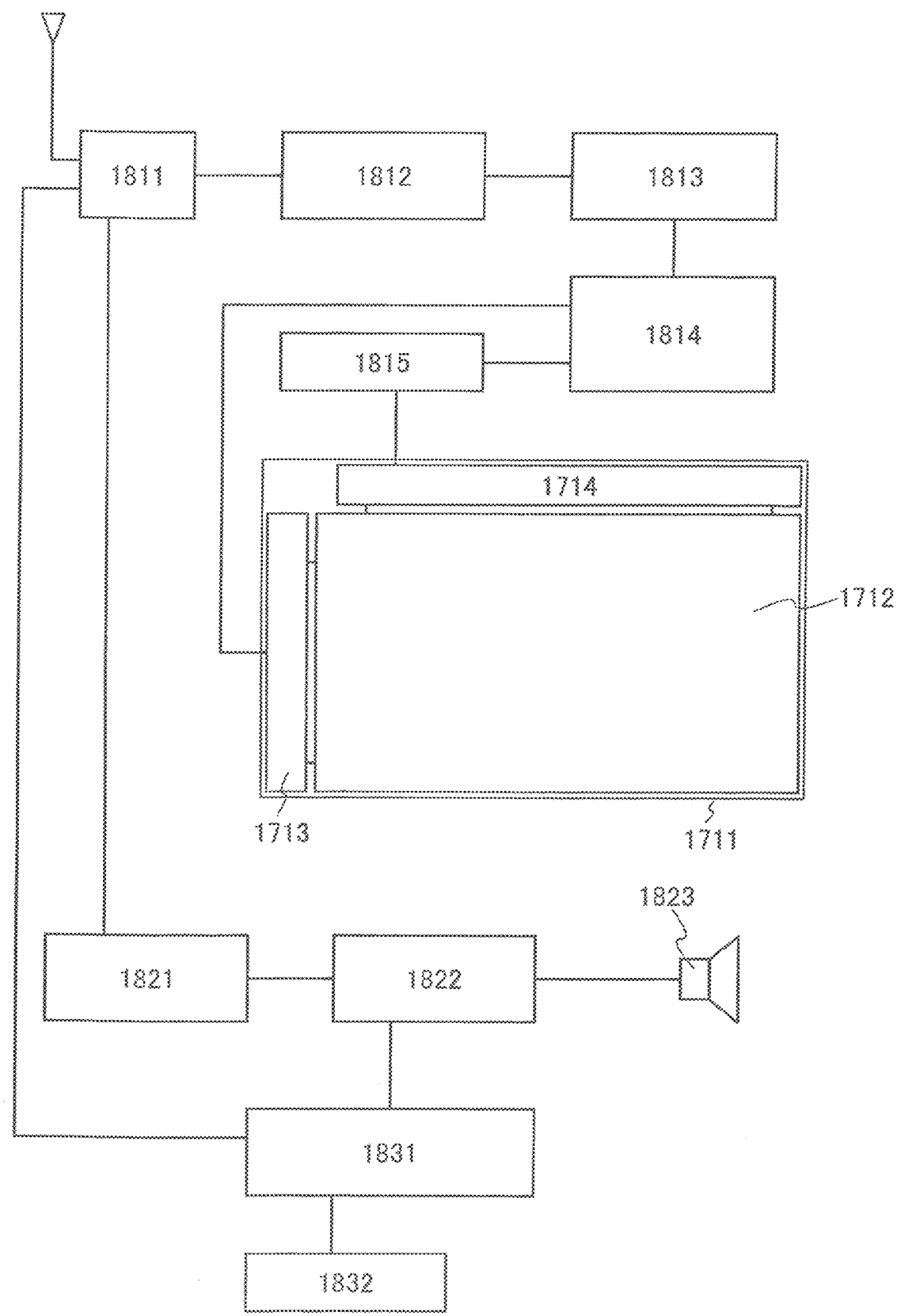
FIG. 16 shows an example of an electronic device.

A television receiving set can be completed using this liquid crystal module or EL module. FIG. 16 is a block diagram showing a main structure of the television receiving set. A tuner 1811 receives a video signal and an audio signal. The video signal is processed by a video signal amplifying circuit 1812; a video signal processing circuit 1813 for converting a signal outputted from the video signal amplifying circuit 1812 into a color signal corresponding to each color of red, green, and blue; and a control circuit 1814 for converting the video signal in accordance with an input specification of a driver IC. The control circuit 1814 outputs signals to the scanning line side and the signal line side. In the case of digital driving, a signal division circuit 1815 may be provided on the signal line side, and the inputted digital signal may be divided into m number and supplied. The display panel 1711 is similar to the one shown in FIG. 15 and includes the pixel portion 1712, the scanning line driver circuit 1713, and the signal line driver circuit 1714 for supplying a video signal to the selected pixel.

Among the signals received by the tuner 1811, the audio signal is sent to an audio signal amplifying circuit 1821. Then, the output of the audio signal is supplied to a speaker 1823 through an audio signal processing circuit 1822. A control circuit 1831 receives control information such as a receiving station (receiving frequency) or sound volume from an input portion 1832 and sends a signal to the tuner 1811 or the audio signal processing circuit 1822.

Figure 17:
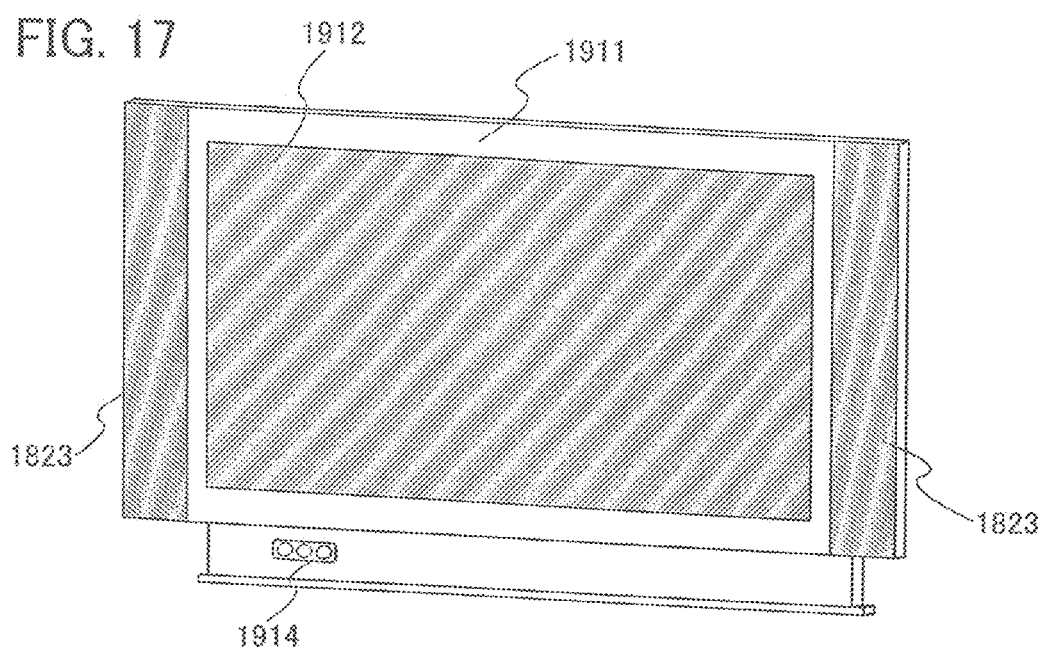
FIG. 17 shows an example of an electronic device.

As shown in FIG. 17, a television receiving set can be completed by incorporating a liquid crystal module or an EL module into a chassis 1911. Using the liquid crystal module or the EL module, a display screen 1912 is formed. Moreover, a speaker 1823, operation switches 1914, and the like are provided appropriately.

This television receiving set includes the display panel 1711. By employing a laser annealing method using a laser irradiation apparatus of the present invention for forming the display panel 1711, it is possible to drastically shorten the process time as compared with another annealing method using radiant heat or conductive heat. In addition, it is possible to conduct a process without giving much thermal damage to a semiconductor substrate, because the substrate is selectively heated. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method using the laser irradiation apparatus of the present invention is superior industrially. By employing the laser annealing method using the laser irradiation apparatus of the present invention, an optical axis displacement in an optical system is prevented; accordingly, a linear beam having a homogeneous intensity can be formed stably. Therefore, homogeneous annealing can be conducted to the substrate. Accordingly, the television receiving set provided with this display panel 1711 can have an advantage that an operation property and reliability are improved.

The present invention is not limited to the television receiving set, and can be applied to various purposes such as a monitor for a computer, and particularly can be applied to a display medium of a large size, such as an information display board at a railway station or an airport, or an advertisement display board on the street.

This application is based on Japanese Patent Application serial no. 2005-310871 filed in Japan Patent Office on Oct. 26, 2005, the entire contents of which are hereby incorporated by reference.

What is claimed is:

1. A manufacturing method of a semiconductor device, comprising the steps of:
    forming a semiconductor film;
    correcting a displacement of a laser beam emitted from a laser oscillator and projecting the laser beam onto a cylindrical lens array by using a transfer lens;
    dividing the laser beam by using the cylindrical lens array;
    superposing the divided laser beams by a condensing lens; and
    crystallizing the semiconductor film by irradiating with the superposed laser beam.

2. The manufacturing method of a semiconductor device according to claim 1, wherein the transfer lens is provided in a position which allows an emission opening of the laser oscillator and an incidence plane of the cylindrical lens array to be conjugated to each other.

3. The manufacturing method of a semiconductor device according to claim 1, wherein the laser beam emitted from the laser oscillator is deflected by a deflecting mirror provided between the laser oscillator and the transfer lens.

4. The manufacturing method of a semiconductor device according to claim 1, further comprising the step of:
adding an impurity element into the crystallized semiconductor film to form a source region and a drain region.

5. The manufacturing method of a semiconductor device according to claim 4, wherein the transfer lens is provided in a position which allows an emission opening of the laser oscillator and an incidence plane of the cylindrical lens array to be conjugated to each other.

6. The manufacturing method of a semiconductor device according to claim 4, wherein the laser beam emitted from the laser oscillator is deflected by a deflecting mirror provided between the laser oscillator and the transfer lens.

* * * * *

UNITED STATES PATENT AND TRADEMARK OFFICE
CERTIFICATE OF CORRECTION

PATENT NO.       : 8,891,170 B2
APPLICATION NO.  : 13/172443
DATED            : November 18, 2014
INVENTOR(S)      : Koichiro Tanaka et al.

It is certified that error appears in the above-identified patent and that said Letters Patent is hereby corrected as shown below:

In the Specification:

Col. 2, line 41, "foaming" should read --forming--

Col. 6, line 24, "Mimed" should read --formed--

Col. 12, lines 38, "Mimed" should read --formed--

Col. 12, line 48, "$1\times10^{2°}/cm^3$" should read --$1\times10^{20}/cm^3$--

Col. 12, lines 48, "$1\times10^{2°}/c$" should read --$1\times10^{20}/cm^3$--

Col. 19, line 63, "400 Ξm," should read --400 μm,--

Col. 21, line 2, "TH" should read --TFT--

Col. 25, line 19, "8236" should read --823G--

Col. 32, line 19, "faulting" should read --forming--

Signed and Sealed this
Nineteenth Day of May, 2015

Michelle K. Lee
*Director of the United States Patent and Trademark Office*